(12) United States Patent
Kim et al.

(10) Patent No.: US 12,670,949 B2
(45) Date of Patent: Jun. 30, 2026

(54) VOLATILE MEMORY DEVICE WITH GLOBAL INPUT AND OUTPUT LINE ALLOCATED FOR METADATA

(71) Applicant: SAMSUNG ELECTRONICS CO., LTD., Suwon-si (KR)

(72) Inventors: Ki-Heung Kim, Suwon-si (KR); Taeyoung Oh, Suwon-si (KR); Hyongryol Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/651,072

(22) Filed: Apr. 30, 2024

(65) Prior Publication Data

US 2024/0404586 A1 Dec. 5, 2024

(30) Foreign Application Priority Data

Jun. 5, 2023 (KR) ........................ 10-2023-0072256
Sep. 14, 2023 (KR) ........................ 10-2023-0122784

(51) Int. Cl.
| | |
|---|---|
| *G11C 7/10* | (2006.01) |
| *G11C 7/18* | (2006.01) |
| *G11C 11/408* | (2006.01) |
| *G11C 11/4091* | (2006.01) |
| *G11C 11/4097* | (2006.01) |

(52) U.S. Cl.
CPC ............ *G11C 11/4097* (2013.01); *G11C 7/18* (2013.01); *G11C 11/4087* (2013.01); *G11C 11/4091* (2013.01)

(58) Field of Classification Search
CPC .............. G11C 11/4097; G11C 7/1048; G11C 11/4093; G11C 11/4076; G11C 11/4096; G11C 11/4091; G11C 7/1069; G11C 2207/005; G11C 7/18
See application file for complete search history.

(56) References Cited

U.S. PATENT DOCUMENTS

| | | | |
|---|---|---|---|
| 6,157,588 | A | 12/2000 | Matsumoto et al. |
| 7,467,323 | B2 | 12/2008 | Fields, Jr. et al. |
| 8,984,212 | B2 | 3/2015 | Choi et al. |
| 10,372,330 | B1 * | 8/2019 | Gans ................... G11C 11/4093 |
| 10,534,704 | B2 | 1/2020 | Park et al. |
| 10,586,576 | B2 | 3/2020 | Nakaoka |
| 10,853,168 | B2 | 12/2020 | Marietta |
| 11,200,118 | B2 | 12/2021 | Buerkle et al. |
| 11,288,188 | B1 | 3/2022 | Tummala et al. |
| 11,391,830 | B2 | 7/2022 | Au et al. |

(Continued)

FOREIGN PATENT DOCUMENTS

| | | |
|---|---|---|
| CN | 1474512 | 2/2004 |
| KR | 10-2006-0078274 | 7/2006 |

OTHER PUBLICATIONS

Extended European Search Report in European Appln. No. 24179478. 3, mailed on Oct. 21, 2024, 10 pages.

*Primary Examiner* — Mushfique Siddique
(74) *Attorney, Agent, or Firm* — Fish & Richardson P.C.

(57) ABSTRACT

A memory device includes a bank connected to a plurality of wordlines, a first global input and output (GIO) line, and a second GIO line formed to have a larger length than the first GIO line in a column direction. One of the first GIO line and the second GIO line may be allocated for metadata.

20 Claims, 14 Drawing Sheets

(56) References Cited

U.S. PATENT DOCUMENTS

| | | | |
|---|---|---|---|
| 2005/0226061 A1* | 10/2005 | Park | G11C 7/22 |
| | | | 365/194 |
| 2012/0297256 A1 | 11/2012 | Plondke et al. | |
| 2020/0005837 A1* | 1/2020 | Katoch | G11C 7/106 |
| 2021/0141692 A1 | 5/2021 | Agarwal et al. | |
| 2021/0247910 A1* | 8/2021 | Kim | G06F 3/0611 |
| 2021/0272620 A1* | 9/2021 | Barry | G11C 11/4093 |
| 2021/0286727 A1 | 9/2021 | Bains | |
| 2022/0084578 A1* | 3/2022 | Li | G11C 11/4093 |
| 2022/0157372 A1 | 5/2022 | He et al. | |
| 2022/0238174 A1 | 7/2022 | Schaefer et al. | |
| 2024/0160351 A1* | 5/2024 | Ayyapureddi | G06F 11/1048 |

* cited by examiner

MAT2

CSLs

LIO2<1:a>

⋮

MAT2

CSLs

LIO2<1:a>

BB

MAT1

CSLs

LIO1<1:a>

⋮

MAT1

CSLs

LIO1<1:a>

GIO2<1:a>

GIO1<1:a>

IOSA2 | DRV2

IOSA1 | DRV1

FIG. 15

NSB                                          MSB

| Normal 8(7) | | | Meta 1 | | | |
|---|---|---|---|---|---|---|
| WL | CSLx[0:15] | | WL | CSLx[m:n] | | |
| 0 | 0 | 63 | 7 | CSLx[0:1] | 0 | 63 |
| 1 | 0 | 63 | 7 | CSLx[2:3] | 0 | 63 |
| 2 | 0 | 63 | 7 | CSLx[4:5] | 0 | 63 |
| 3 | 0 | 63 | 7 | CSLx[6:7] | 0 | 63 |
| ⋮ | | | ⋮ | | | |
| 6 | 0 | 63 | 7 | CSLx[12:13] | 0 | 63 |
| 7 | 0 | 63 | 7 | CSLx[14:15] | 0 | 63 |

Unassigned

FIG. 16

NSB                                          MSB

| Normal 16(15) | | | Meta 1 | | | |
|---|---|---|---|---|---|---|
| WL | CSLx[0:15] | | WL | CSLx[m] | | |
| 0 | 0 | 63 | 15 | CSLx[0] | 0 | 63 |
| 1 | 0 | 63 | 15 | CSLx[1] | 0 | 63 |
| 2 | 0 | 63 | 15 | CSLx[2] | 0 | 63 |
| 3 | 0 | 63 | 15 | CSLx[3] | 0 | 63 |
| ⋮ | | | ⋮ | | | |
| 14 | 0 | 63 | 15 | CSLx[14] | 0 | 63 |
| 15 | 0 | 63 | 15 | CSLx[15] | 0 | 63 |

Unassigned

VOLATILE MEMORY DEVICE WITH GLOBAL INPUT AND OUTPUT LINE ALLOCATED FOR METADATA

CROSS-REFERENCE TO RELATED APPLICATION(S)

This U.S. non-provisional application claims priority under 35 USC § 119 to Korean Patent Application Nos. 10-2023-0072256, filed on Jun. 5, 2023, and 10-2023-0122784, filed on Sep. 14, 2023, in the Korean Intellectual Property Office, the disclosures of which are herein incorporated by reference in their entirety.

BACKGROUND

Semiconductor memory devices may be classified into volatile memory devices and nonvolatile memory devices. Volatile memory devices lose their stored data when their power supplies are interrupted. A dynamic random access memory (DRAM) is a type of nonvolatile memory device and is used in various fields such as mobile systems, servers, and graphics devices.

SUMMARY

This disclosure relates to a volatile memory device for allocating specific data.

In general, an innovative aspect of the subject matter described in this specification is a memory device including: a bank connected to a plurality of wordlines, a first global input and output (GIO) line, and a second GIO line formed to have a larger length than the first GIO line in a column direction. One of the first GIO line and the second GIO line may be allocated for metadata.

Another general aspect is a memory device including: a bank, connected to a plurality of wordlines, a first global input and output (GIO) line, and a second GIO line formed to have a larger length than the first GIO line in a column direction, and a row decoder connected to the plurality of wordlines, extending in the column direction, and configured to select the plurality of wordlines. One of the first GIO line and the second GIO line may be allocated for metadata.

Another general aspect is a memory device including: a bank comprising a plurality of subbanks divided in a column direction, a plurality of wordlines, each extending in a row direction and connected to the plurality of subbank, and a plurality of global input and output (GIO) lines extending in the column direction and connected to the plurality of subbanks. The plurality of GIO lines may include two GIO lines connected to different subbanks, and one of the two GIO lines may be allocated for metadata.

BRIEF DESCRIPTION OF THE DRAWINGS

The above and other aspects, features, and advantages of the present disclosure will be more clearly understood from the following detailed description, taken in conjunction with the accompanying drawings.

FIG. 1 is a diagram illustrating an example of a memory system.

FIGS. 3 and 4 are diagrams illustrating examples of operations of a first bank.

FIGS. 5 and 6 are diagraming illustrating an example of operations of a second bank.

FIG. 7 is a diagram illustrating an example of a bank.

FIG. 8 is a diagram illustrating an example of region "A" of FIG. 7.

FIG. 10 illustrates an example of the operation of a bank when the metadata mode is turned on.

FIGS. 15 and 16 are diagrams illustrating examples of column select signals of normal data and metadata.

DETAILED DESCRIPTION

Figure 1:
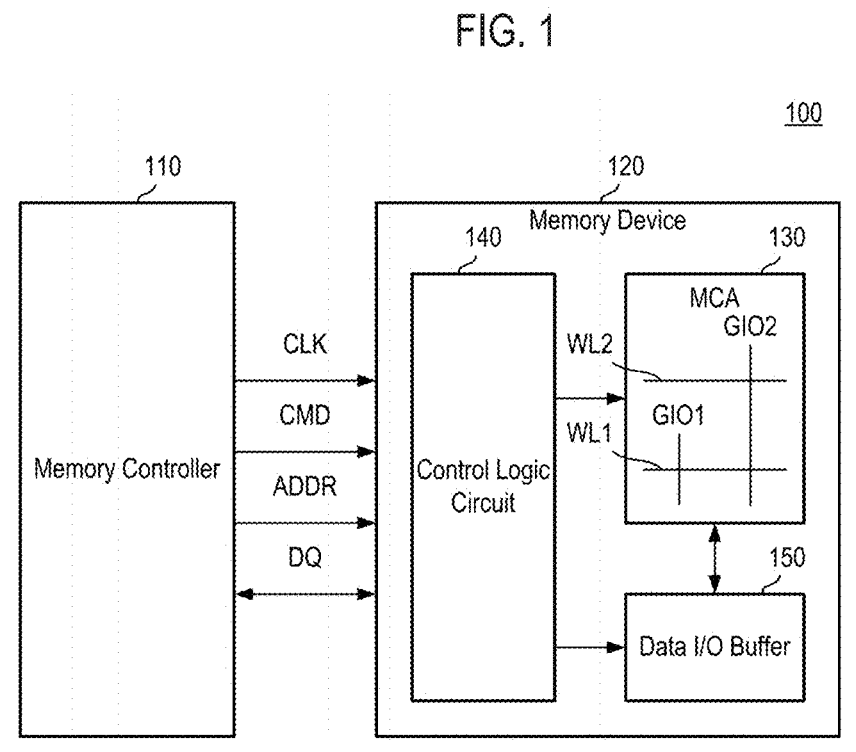
Figure 2:
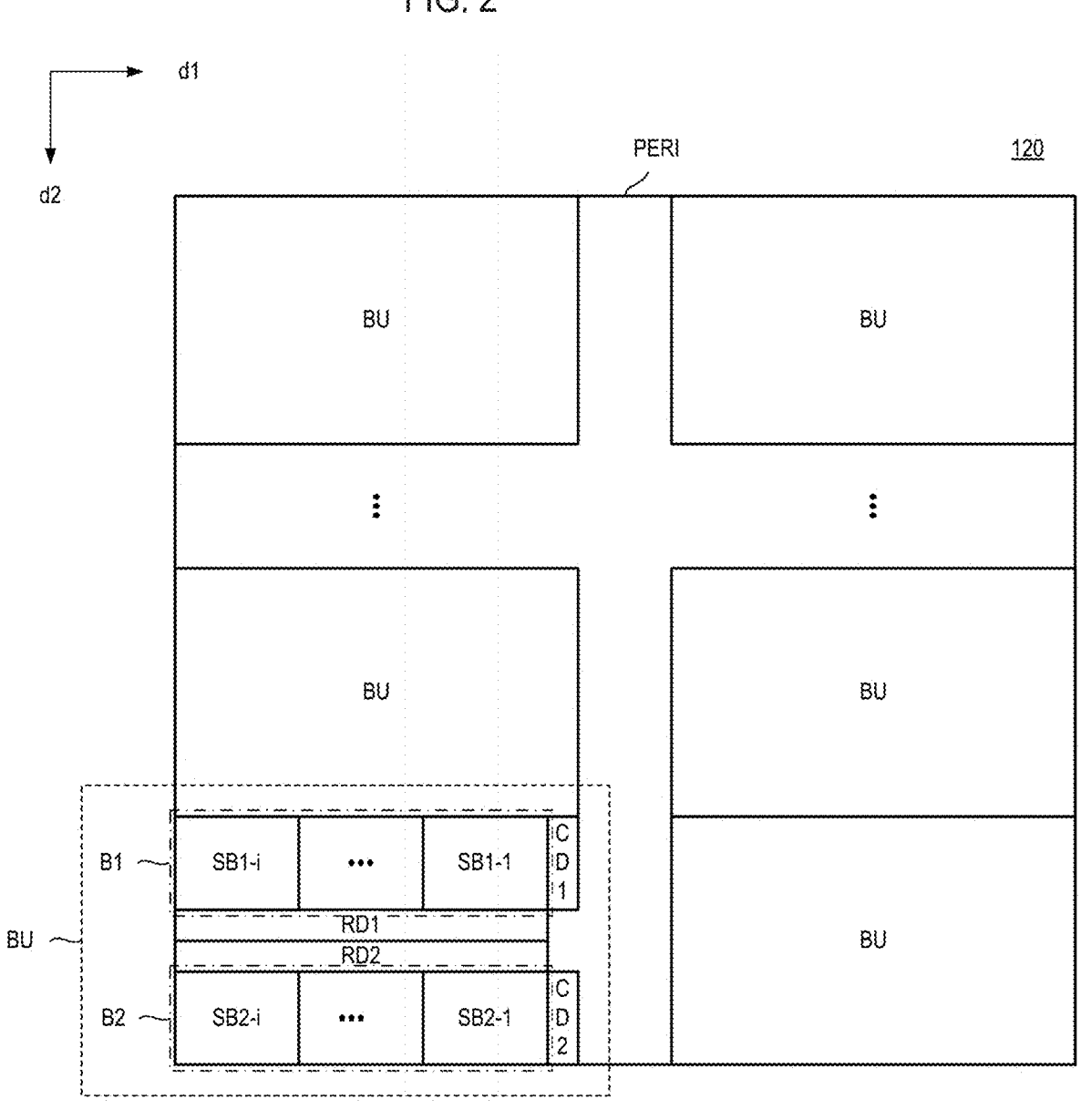
FIG. 2 is a plan view of an example of a memory device.

FIG. 1 is a diagram illustrating an example of a memory system.

Referring to FIG. 1, a memory system 100 includes a memory controller 110 and a memory device 120.

The memory controller 110 may control the overall operation of the memory system 100 and may control data exchange between the memory device 120 and a host device connected to the memory system 100. For example, the memory controller 110 may control the memory device 120 to write or read data based on a request from the host device.

The memory controller 110 may communicate with the memory device 120 through a memory interface or communicate with a host device through a host interface. Accordingly, the memory controller 110 may mediate a signal between the host device and the memory device 120. The memory controller 110 may control the memory device 120 based on a command CMD for controlling the memory device 120. For example, the memory device 120 may include a dynamic random access memory (DRAM), a double data rate 4 (DDR4) synchronous DRAM (SDRAM), a DDR5 SDRAM, a DDR6 SDRAM, a low-power DDR4 (LPDDR4) SDRAM, an LPDDR5 SDRAM, an LPDDR6 SDRAM, or the like. However, the present disclosure is not limited thereto, and the memory device 120 may include a nonvolatile memory device. However, in some implementations, an example will be provided in the memory device 120 is a volatile memory.

The memory controller 110 may transmit the above-described command CMD, a clock signal CLK, and an address ADDR to the memory device 120. The memory controller 110 may provide data DQ to the memory device 120 and may receive data DQ from the memory device 120. The memory device 120 may include a memory cell array 130 in which data DQ is stored, a control logic circuit 140, a data input and/or output buffer 150, or the like.

The memory cell array 130 may include a plurality of memory cells. Each memory cell may store data, e.g., 1 bit. The memory cell array 130 may include a plurality of wordlines WL1 and WL2 and a plurality of global input and output (GIO) lines, and a plurality of memory cells may be connected to each wordline and each GIO line. For example, the wordline and the GIO line may constitute a single set configured to output a data prefetch size required for the memory device 120.

The plurality of GIO lines GIO1 and GIO2 may be configured to transmit data written in or read from selected wordline and a column select line (CSL) among the plurality of wordlines WL1 and WL2 and the plurality of CSLs. The memory device may be driven at high speed and data loading may be reduced through the plurality of GIO lines GIO1 and GIO2. In this case, memory cells connected to a wordline may be referred to as a row, and memory cells selected by a plurality of CSLs may be referred to as a column.

In some implementations, the plurality of GIO lines GIO and GIO2 may include a first GIO line GIO1 and a second GIO line GIO2. The first GIO line GIO1 and the second GIO line GIO2 may have different lengths or pitches. For example, the second GIO line GIO2 may be configured to be longer than the first GIO line GIO1 in a column direction. Since the first GIO line GIO1 is shorter than the second GIO line GIO2, the first GIO line GIO1 may be referred to as a short GIO line, and the second GIO line GIO2 may be referred to as a long GIO line.

The first GIO line GIO1 and the second GIO line GIO2 may be formed of different metals. Since the second GIO line GIO2 is arranged to be longer than the first GIO line GIO1, a speed at which data is transmitted may relatively decrease as loading increases. Accordingly, the second GIO line GIO2 may be formed of metal capable of achieving a higher data rate than the first GIO line GIO1.

In some implementations, some of the GIO lines may be allocated for metadata. In some implementations, metadata may refer to data used to improve performance of the memory device 120 or to enhance security. For example, one of the first GIO line GIO1 and the second GIO line GIO2 may be allocated for metadata. The other one of the first GIO line GIO1 and the second GIO line GIO2 may be allocated for normal data corresponding to the metadata. The normal data may be defined as data other than the metadata.

In some implementations, a ratio of normal data to metadata accessed by the memory device 120 may be required. For example, the required ratio of normal data and metadata accessed by the memory device 120 (hereinafter, a required normal/meta ratio) may be set to n:1 (where n is a positive integer). For example, n may be 8 or 16, but the present disclosure is not limited thereto. For example, in the case in which n=8, 8 bytes of metadata may be required to be accessed when 64 bytes of normal data are accessed. Therefore, a ratio of metadata input or output from one of the first GIO line GIO1 and the second GIO line GIO2 to normal data output from the other one of the first GIO line GIO1 and the second GIO line GIO2 may be 1:n.

The control logic circuit 140 may receive a command CMD and an address ADDR from the memory controller 110. The control logic circuit 140 may control the memory cell array 130 based on the command CMD and the address ADDR. For example, the control logic circuit 140 may decode the command CMD and generate control signals corresponding to the decoded command CMD. In addition, the control logic circuit 140 may generate internal command (CMD) signals such as a refresh signal, an active signal, a precharge signal, a read signal, or a write signal. In addition, the control logic circuit 140 may decode the address ADDR and select or activate a wordline and a CSL corresponding to the decoded address ADDR.

In some implementations, the control logic circuit 140 may control the memory device to simultaneously activate a first wordline WL1 corresponding to the first GIO line GIO1 and a second wordline WL2 corresponding to the second GIO line GIO2, among the plurality of wordlines. Based on the simultaneous activation of the first wordline WL1 and the second wordline WL2 under the control of the control logic circuit 140, the first GIO line GIO1 and the second GIO line GIO2 corresponding to a wordline may simultaneously input or output the normal data and the metadata. For example, metadata (or normal data) written or read in response to the activated first wordline WL1 may be input or output from the first GIO line GIO1, and normal data (or metadata) written or read in response to the activated second wordline WL2 may be simultaneously input or output from the second GIO line GIO2.

The data input and/or output buffer 150 may provide normal data and/or metadata to memory cell array 130 based on a clock signal CLK when a write operation is performed or may provide normal data and/or metadata provided from memory cell array 130 to the memory controller 110 based on a clock signal CLK when a read operation is performed.

For example, the data input and/or output buffer 150 may provide normal data and metadata, simultaneously input or output from the memory cell array 130, to the memory cell array 130, or the memory controller 110.

In this example, an operation mode of a memory system in which normal data and metadata are simultaneously written or read may be defined as a metadata mode. For example, the metadata mode may be an operation mode for inputting or outputting the metadata. In the metadata mode, the memory controller 110 and the control logic circuit 140 may control the memory device 120 to simultaneously write or read the normal data and the metadata through the first GIO line GIO1 allocated to the normal data (or metadata) and the second GIO line GIO2 allocated to the metadata (or normal data).

In this example, a portion of the GIO lines connected to the memory cell array 130 included in the memory device 120 may be, for example, allocated for metadata. When a wordline and a GIO line constitute a single set, two accesses may be required to write or read normal data and metadata, resulting in performance degradation. In some implementations, a portion of the first GIO line GIO1 and the second GIO line GIO2 may be allocated for metadata, and the number of activated wordlines may be doubled, allowing normal data and metadata to be simultaneously written or read.

FIG. 2 is a plan view of an example of a memory device.

Referring to FIG. 2, the memory device 120 includes a bank unit BU and a peripheral circuit region PERI.

The bank unit BU, also known as a "bank group," may be provided in plural depending on the capacity of the memory device 120. A portion of the plurality of bank units BU and the remaining portion may be arranged in a row direction d2 with a peripheral circuit region PERI interposed therebetween. Each of the bank units BU may include a plurality of banks. Each of the plurality of banks may include a plurality of mats including a plurality of memory cells.

In some implementations, each of the plurality of banks may include a plurality of subbanks. A plurality of subbanks, included in each bank, may correspond to the same bank address. A plurality of subbanks provided for each bank may be i subbanks (where i is a positive integer). A plurality of subbanks may be divided and arranged in a column direction d1 within a single bank. Each of the plurality of subbanks may be connected to a plurality of wordlines.

For example, a first bank B1 may include to subbanks SB1-1 to SB1-i, and the subbanks SB1-1 to SB1-i may be arranged in the column direction d1. In addition, a second bank B2 disposed in a row direction d2 from the first bank B1 may include subbanks SB2-1 to SB2-i, and the subbanks SB2-1 to SB2-i may be arranged in the column direction d1.

Row decoders RD1 and RD2 may extend in the column direction d1 and may be provided in a number corresponding to the number of banks included in a single bank unit BU. In some implementations, the row decoders RD1 and RD2 may select wordlines connected to different banks B1 and B2 based on decoding a row address.

In some implementations, each of the row decoders RD and RD2 may simultaneously select at least two wordlines connected to different subbanks, among a plurality of wordlines connected to subbanks included in the banks B1 and B2, to read or write normal data ND and metadata MD. For example, the first row decoder RD1 may simultaneously select at least two wordlines connected to at least two subbanks from among the 1-i subbanks SB1-1 to SB1-i, and the second row decoder RD2 may simultaneously select at least two wordlines connected to at least two subbanks from among the subbanks SB2-1 to SB2-i.

The column decoders CD1 and CD2 may extend in the row direction d2 and may be provided in a number corresponding to the number of banks included in a single bank unit BU. In some implementations, the column decoders CD1 and CD2 may select subbanks included in the same bank and a CSL connected to the first GIO line and the second GIO line based on decoding a column address. For example, the first column decoder CD1 may select a CSL connected to the subbanks SB1-1 to SB1-i, and the second column decoder CD2 selects a CSL connected to the subbank SB2-1 to SB2-i.

Figure 3:
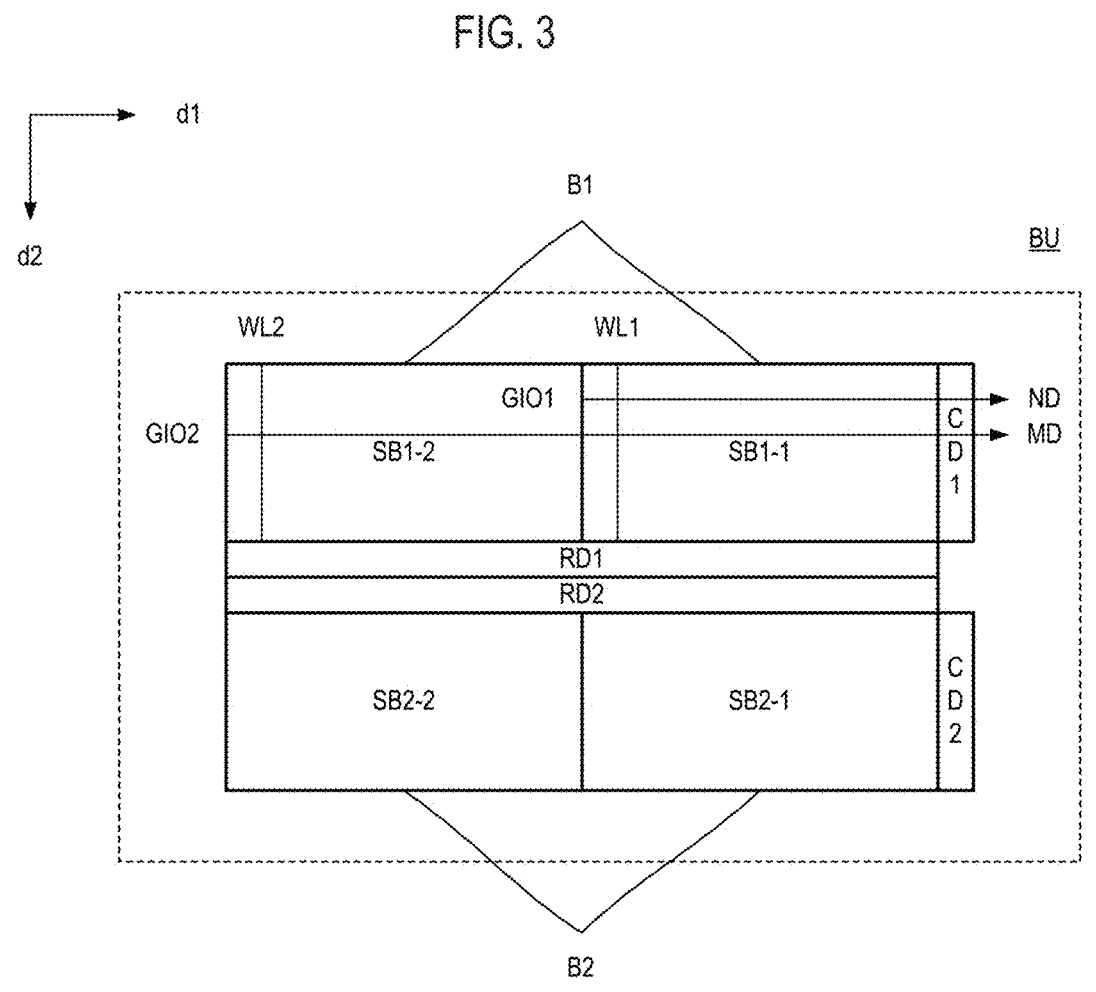
Figure 4:
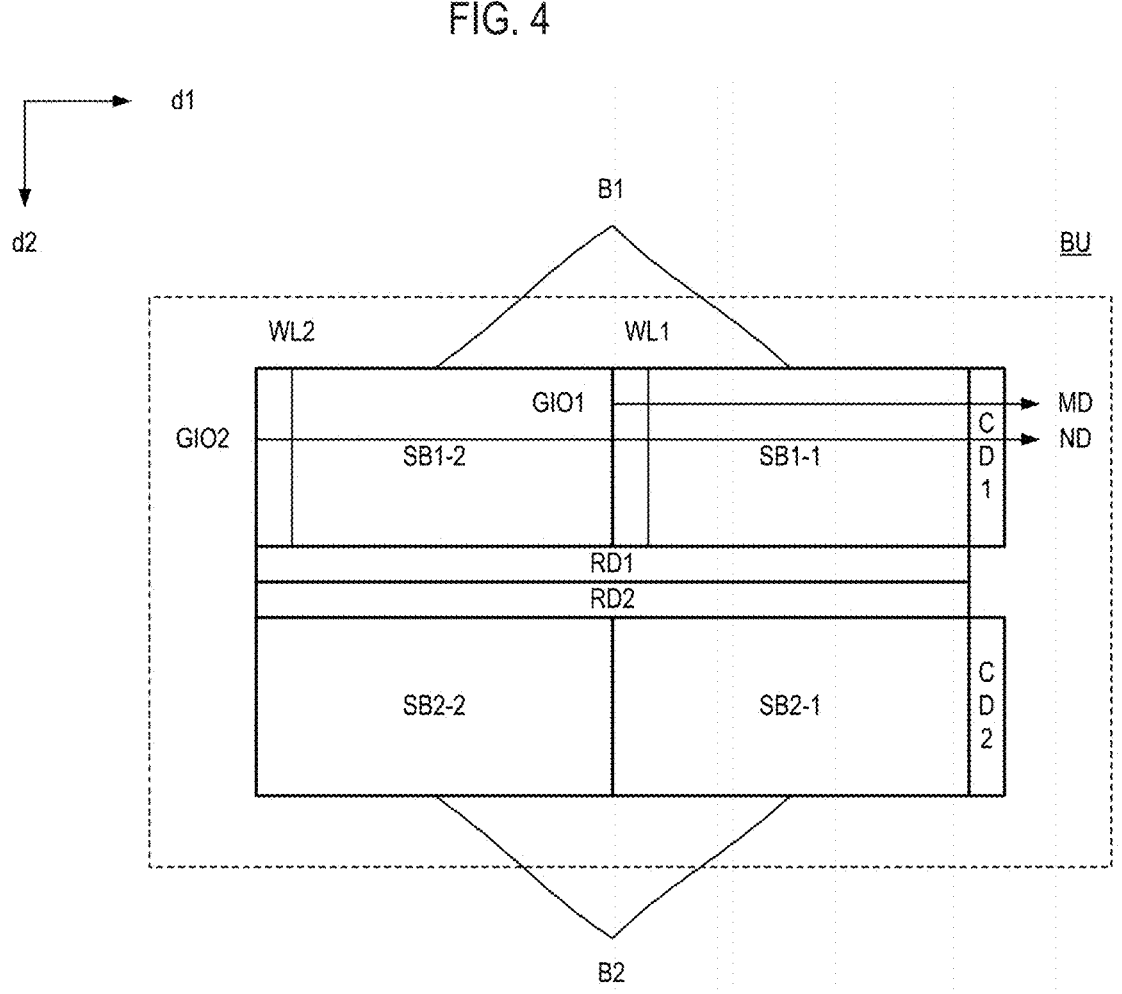

FIGS. 3 and 4 are diagrams illustrating examples of operations of the first bank.

Referring to FIGS. 3 and 4, a bank unit BU includes a first bank B1, connected to a first row decoder RD1 and a first column decoder CD1 and a second bank B2 connected to a second row decoder RD2 and a second column decoder CD2. The first bank B1 includes a subbank SB1-1 and a subbank SB1-2, and the second bank B2 includes a subbank SB2-1 and a subbank SB2-2.

A first GIO line GIO1 and a second GIO line GIO2 may be arranged in the first bank B1. For example, the first GIO line GIO1 and the second GIO line GIO2 may be shared and arranged in the first bank B1. In this case, the first GIO line GIO1 may be connected to the subbank SB1-1, and the second GIO line GIO2, which is longer than first GIO line GIO1 may be connected to the subbank SB1-2. For example, the first GIO line GIO1 having a relatively small length may be connected to a subbank SB1-1 closer to the first column decoder CD1, and the second GIO line GIO2 having a relatively large length may be connected to a subbank SB1-2 distant from the first column decoder CD1. A first wordline WL1 may be connected to the subbank SB1-1, and a second wordline WL2 may be connected to the subbank SB1-2.

In some implementations, as illustrated in FIG. 3, the first GIO line GIO1 connected to the subbank SB1-1 may be used for normal data ND, and the second GIO line GIO2 connected to the subbank SB1-2 may be used for metadata MD. In this case, the first GIO line GIO1 for normal data ND of the subbank SB1-1 may correspond to the second GIO line for metadata MD of the subbank SB1-2. A portion of memory cells included in the subbank SB1-2 connected to the second GIO line GIO2 may be used to store metadata MD corresponding to normal data ND stored in a portion of memory cells included in the subbank SB1-1.

In some implementations, normal data ND and metadata MD corresponding to the normal data ND may be simultaneously written in or read from the first bank B1. When a read operation is performed on the normal data ND and the metadata MD written in the first bank B1, the normal data ND and the metadata MD may be read based on simultaneously enabling two wordlines for each subbank. For example, the first row decoder RD1 may simultaneously select the first wordline WL1 and the second wordline WL2 to simultaneously read or write normal data and metadata. In addition, the first column decoder CD1 may select a CSL.

Then, the normal data ND and the metadata MD may be read from memory cells corresponding to the selected first wordline WL1, the selected second wordline WL2, and the CSL and may be transmitted to the second GIO line GIO2. For example, the normal data ND may be read from the subbank SB1-1 connected to the first wordline WL1 and the first GIO line GIO1, and the metadata may be read from the subbank SB1-2 connected to the second wordline WL2 and the GIO line GIO2. In this case, the first GIO line GIO1 allocated for the normal data ND may output the normal data ND, and the second GIO line GIO2 allocated for the metadata MD may output the metadata MD.

Alternatively, in some implementations, a write operation of normal data ND and metadata MD corresponding to the normal data ND may also be performed simultaneously. When the write operation of the normal data ND and the metadata MD is performed on a first bank B1, two wordlines may be simultaneously activated for each subbank, and the normal data ND and the metadata MD may be simultaneously written through the two wordlines. For example, the first row decoder RD1 may simultaneously select a first wordline WL1 and a second wordline WL2, and the first column decoder CD1 may select a CSL.

In response to the selected first wordline WL1, the selected second wordline WL2, and the selected CSL the normal data ND may be transmitted to a portion of memory cells included in the subbank SB1-1 through the first GIO line GIO1, and the metadata MD may be written to a portion of memory cells included in the subbank SB1-2 through the second GIO line GIO2. In this case, the first GIO line GIO1 allocated for the normal data ND may input the normal data ND, and the second GIO line GIO2 allocated for the metadata MD may input the metadata MD.

Alternatively, as illustrated in FIG. 4, the first GIO line GIO1 connected to the subbank SB1-1 may be used for metadata MD, and the second GIO line GIO2 connected to the subbank SB1-2, which is longer than subbank SB1-1, may be used for normal data ND. In this case, the first GIO line GIO1 for the metadata MD of the subbank SB1-1 may correspond to the second GIO line GIO2 for the normal data ND of the subbank SB1-2. A portion of the memory cells included in the subbank SB1-1 connected to the first GIO line GIO1 may be used to store the metadata MD corresponding to the normal data ND stored in a portion of the memory cells included in the subbank SB1-2 connected to the second GIO line GIO2.

In some implementations, when normal data ND and metadata MD corresponding to the normal data ND are simultaneously written in or read from the first bank B1, the normal data ND and the metadata MD may be read from memory cells corresponding to the first wordline WL, the second wordline WL2, and the CSL selected simultaneously through the first row decoder RD1 and the first column decoder CD1, and may then transmitted to the first GIO line GIO1 and the second GIO line GIO2. For example, the metadata MD may be read from the subbank SB1-1 connected to the first wordline WL1 and the first GIO line GIO1, and the normal data ND may be read from the subbank SB1-2 connected to the second wordline WL2 and the second GIO line GIO2. In this case, the second GIO line GIO2 allocated for the normal data ND may output the normal data ND, and the first GIO line GIO1 allocated for the metadata MD may output the metadata MD.

Alternatively, in some implementations, a write operation of normal data ND and metadata MD corresponding to the normal data ND may also be performed simultaneously. When the write operation of the normal data ND and the metadata MD is performed on a first bank B1, two wordlines may be simultaneously activated for each subbank, and the normal data ND and the metadata MD may be simultaneously written through the two wordlines. In response to the first wordline WL1, second wordline WL2, and CSL selected through the first row decoder RD1 and the first column decoder CD1, the metadata MD may be written in a portion of memory cells included in the subbank SB1-1 through the first GIO line GIO1, and the normal data ND may be written in a portion of memory cells included in the subbank SB1-2 through the second GIO line GIO2. In this case, the first GIO line GIO1 allocated for the metadata MD may input the metadata MD, and the second GIO line GIO2 allocated for the normal data ND may input the normal data ND.

Figure 5:
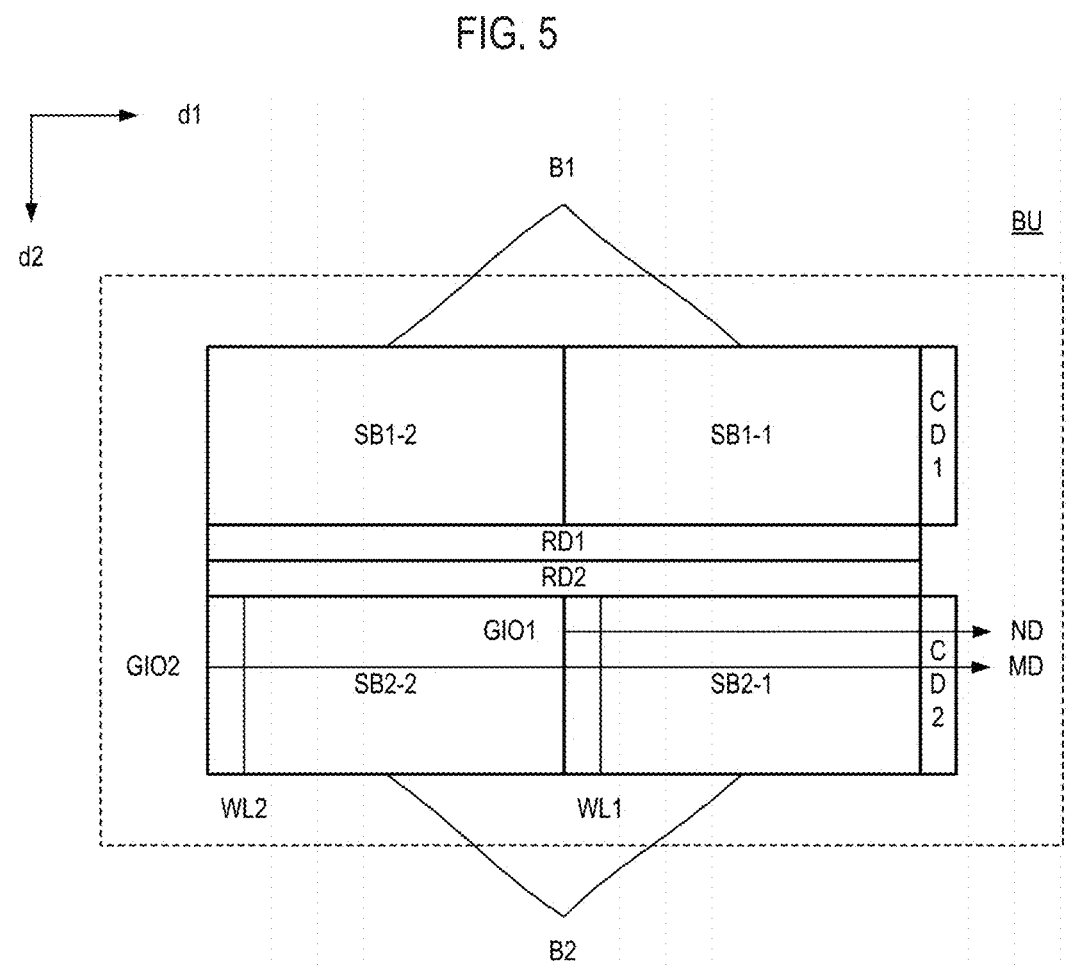
Figure 6:
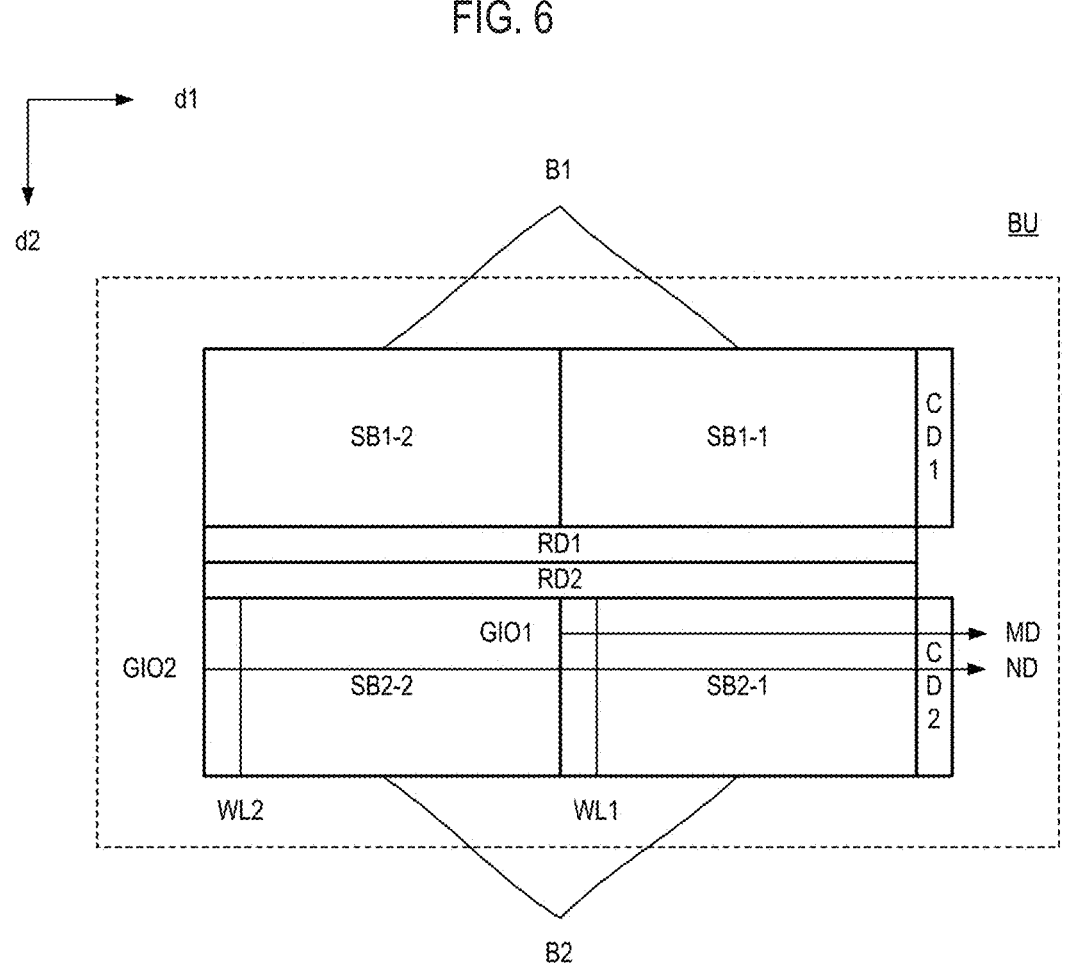

FIGS. 5 and 6 are diagrams illustrating operations examples of the second bank. Hereinafter, detailed descriptions of parts overlapping with those described above in FIGS. 3 and 4 will be omitted.

Referring to FIGS. 5 and 6, the first GIO line GIO1 and the second GIO line GIO2 may also be arranged in the second bank B2, similarly to first bank B1. In this case, the first GIO line GIO1 having a relatively small length may be connected to a subbank SB2-1, and the second GIO line GIO2 having a relatively large length may be connected to a subbank SB2-2. In addition, a first wordline WL1 may be connected to the subbank SB2-1, and a second wordline WL2 may be connected to the subbank SB2-2.

In some implementations, as illustrated in FIG. 5, the first GIO line GIO1 connected to the subbank SB2-1 may be used for normal data ND, and the second GIO line GIO2 connected to the subbank SB2-2 may be used for metadata MD. In this case, the first GIO line GIO1 for normal data ND of the subbank SB2-1 may correspond to the second GIO line GIO2 for metadata MD of the subbank SB2-2. A portion of memory cells included in the subbank SB2-2 connected to the second GIO line GIO2 may be used to store the metadata MD corresponding to normal data ND stored in a portion of memory cells included in the subbank SB2-1 connected to the first GIO line GIO1.

In some implementations, normal data ND and metadata MD corresponding to the normal data ND may be simultaneously written in or read from the second bank B2. For example, the normal data ND and the metadata MD may be simultaneously written or read through the two wordlines based on simultaneously enabling the two wordlines for each subbank. For example, the second row decoder RD2 may simultaneously select the first wordline WL1 and the second wordline WL2 to read or write the normal data ND and the metadata MD, and the second column decoder CD2 may select the CSL.

Then, the normal data ND read from memory cells corresponding to the selected first wordline WL1, the selected second wordline WL2, and the selected CSL may be output through the first GIO line GIO1, and the read metadata MD may be output through the second GIO line GIO2. Alternatively, the normal data ND input through the first GIO line GIO1 may be written in memory cells corresponding to the selected first wordline WL1, the selected second wordline WL2, and the selected CSL and the metadata MD input through the second GIO line GIO2 may be written in the memory cells.

Alternatively, as illustrated in FIG. 6, the first GIO line GIO1 connected to the subbank SB2-1 and having a relatively small length may be used for metadata MD, and the second GIO line GIO2 connected to the subbank SB2-2 and having a relatively large length may be used for normal data ND. In this case, the first GIO line GIO1 for metadata MD of the subbank SB2-1 may correspond to the second GIO line GIO2 for normal data ND of the subbank SB2-2. A portion of the memory cells included in the subbank SB2-1 connected to the first GIO line GIO1 may be used to store the metadata MD corresponding to the normal data ND stored in a portion of the memory cells included in the subbank SB2-2 connected to the second GIO line GIO2.

In some implementations, when normal data ND and metadata MD corresponding to the normal data ND are simultaneously written in or read from the second bank B2, the metadata MD read from memory cells corresponding to the first wordline WL1, the second wordline WL2, and the CSL simultaneously selected through the second row decoder RD2 and the second column decoder CD2, may be output through the first GIO line GIO1, and the read normal data ND may be output through the second GIO line GIO2. Alternatively, the metadata MD input through the first GIO line GIO1 may be written in memory cells corresponding to the selected first wordline WL1, the selected second wordline WL2, and the selected CSL and the normal data ND input through the second GIO line GIO2 may be written in the memory cells.

In this example, a bank may include a single subbank connected to a first GIO line GIO1 having a relatively small length and a single subbank connected to a second GIO line GIO2 having a relatively large length. Each GIO line may be connected to each subbank, but may be shared and arranged in terms of bank. Each GIO line may be allocated for either one of the normal data ND and the metadata MD, and wordlines connected to each subbank may be simultaneously activated. Accordingly, the bank is capable of simultaneously writing or reading the normal data ND and the metadata MD through a single access, and a write or read operation may be performed without timing loss or restrictions.

Figure 7:
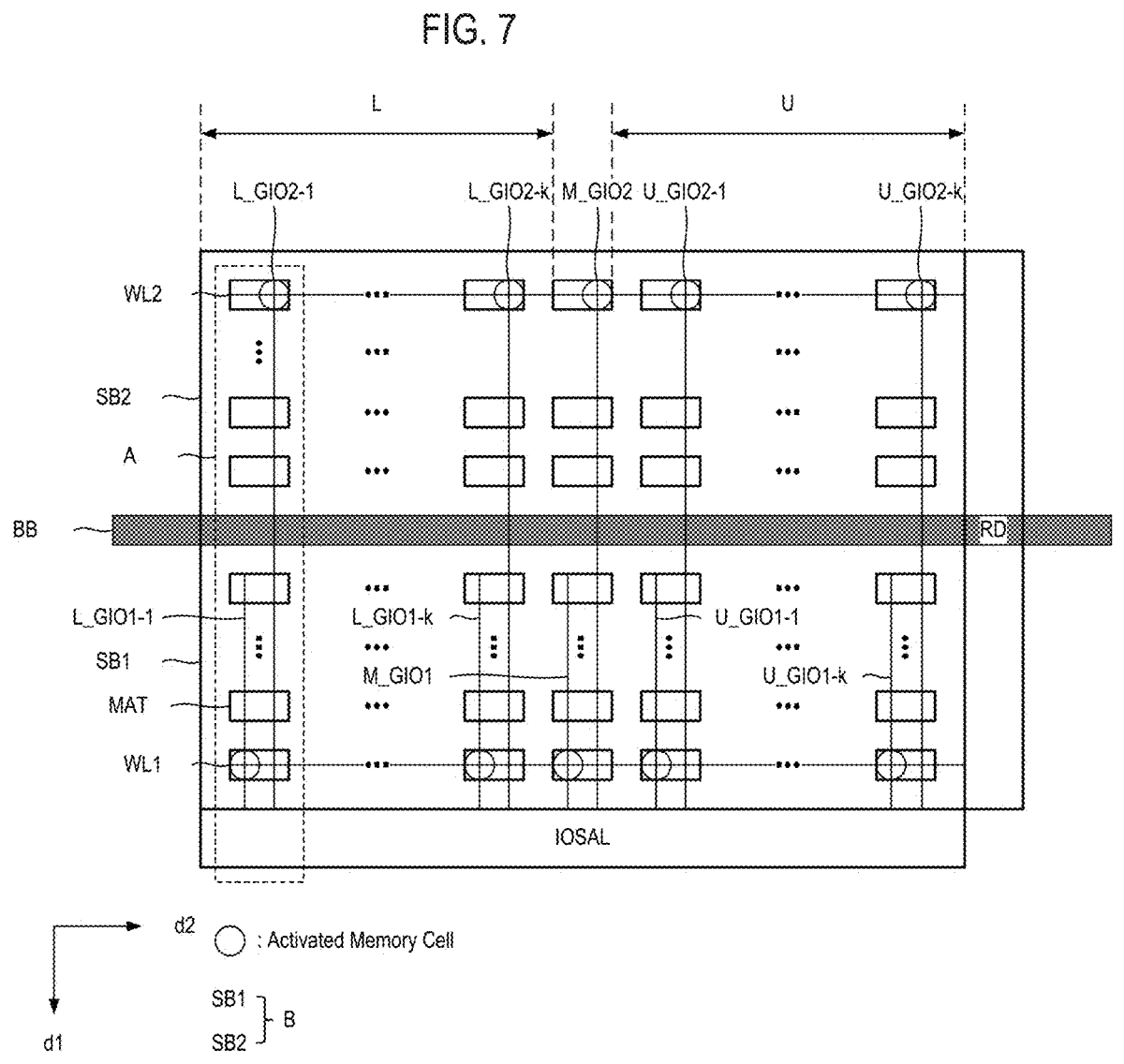

FIG. 7 is a diagram illustrating an example of a bank.

Referring to FIG. 7, a bank B may correspond to one of the banks B described above in FIGS. 2 to 6. The bank B may be connected to a first wordline WL1 and a second wordline WL2 extending in a row direction d2, and a plurality of first GIO lines L_GIO1-1 to L_GIO1-k extending in a column direction d1, a plurality of second GIO lines L_GIO2-1 to U_GIO2-k, a row decoder RD, and input/output sense amplifier stage IOSAL. A plurality of wordlines, including the first wordline WL1 and the second wordline WL2, may be connected to the bank B, but only the first and second wordlines WL1 and WL2, simultaneously selected by the row decoder RD, are illustrated in FIG. 7. In addition, the first and second GIO lines corresponding to each column are each illustrated as one for brevity of the drawing, but a plurality of lines may be provided in response to a size of burst length, which may be input and output for each column. For example, N first GIO lines and N second GIO lines may each be provided (where N is a positive integer). For example, 2N GIO lines may be provided for a single bank B.

The bank B may include a first subbank SB1 and a second subbank SB2. The first subbank SB1 and the second subbank SB2 may be divided by a bank boundary BB. In some implementations, the bank boundary BB may include a plurality of dummy memory cells.

A plurality of first GIO lines L_GIO1-1 to U_GIO1-k arranged in the bank B may be connected to the first subbank SB1, and a plurality of second GIO lines L_GIO2-1 to U_GIO2-k may be connected to the second subbank SB2. In this case, the plurality of second GIO lines L_GIO2-1 to U_GIO2-k are commonly arranged in the first subbank SB1 and the second subbank SB2 but may be connected to the second subbank SB2 to input and output data written in or read from mats MATs included in the second subbank SB2.

Each subbank may include a plurality of MATs. Some wordlines and some GIOs may be connected to each MAT. A MAT may include an array of memory cells arranged two-dimensionally, and each of the memory cells may be connected to one of the wordlines connected to the MAT and one of the GIOs connected to the MAT. For example, a MAT included in the first subbank SB1 and memory cells included in the MAT are connected to a first GIO line, and a MAT included in a second subbank SB2 and memory cells included in the MAT may be connected to a second GIO line.

In some implementations, a plurality of GIO lines may be classified into one of a first side, a second side, and a third side. Each side may correspond to at least one column. In this case, MATs included in the second side may be used for error correction code (ECC). For example, MATs included in the second side may store parity bits for ECC. Accordingly, among the plurality of GIO lines, a first GIO line M_GIO1 and a second GIO line M_GIO2 of the second side may input or output parity bits.

First GIO lines L_GIO1-1 to L_GIO1-k of the first side may be allocated for normal data ND (or metadata MD), and second GIO lines L_GIO2-1 to L_GIO2-k of the first side may be allocated for metadata MD (or normal data ND). Similarly, first GIO lines U_GIO1-1 to U_GIO1-k of the third side may be allocated for normal data ND (or metadata MD), and second GIO lines U_GIO2-1 to U_GIO2-k of the third side may be allocated for metadata MD (or normal data ND). In this case, when the first GIO lines L_GIO1-1 to L_GIO1-k and U_GIO1-1 to U_GIO1-k of the first and third sides may be allocated for normal data ND, the second GIO lines L_GIO2-1 to L_GIO2-k and U_GIO2-1 to U_GIO2-k of the first and third sides may be allocated for metadata MD. When the first GIO lines L_GIO1-1 to L_GIO1-k and U_GIO1-1 to U_GIO1-k are allocated for metadata MD, the second GIO lines L_GIO2-1~L_GIO2-k and U_GIO2-1 to U_GIO2-k of the first and third sides may be allocated for normal data ND.

The first GIO lines, L_GIO1-1 to L_GIO1-k, and the second GIO lines, L_GIO2-1 to L_GIO2-k, are provided with k lines each (where k is a positive integer). Similarly, the first GIO lines U_GIO1-1 to U_GIO1-k and second GIO lines U_GIO2-1 to U_GIO2-k of the three side may be provided with k lines each.

In some implementations, when the first wordline WL1 and the second wordline WL2 are simultaneously activated through a row decoder RD, data may be written in or read from a plurality of MATs corresponding to the first wordline WL1 and a plurality of MATs corresponding to the second wordline WL2. For example, the first wordline WL1 and the second wordline WL2 are simultaneously activated, so that a single column may be selected for each of the subbanks SB1 and SB2 (in addition, a CSL may be selected through a column decoder, not illustrated). By selecting the first wordline WL1 and the CSL a portion of the memory cells connected to a column corresponding to the first wordline WL1 may be activated. In addition, by selecting the second wordline WL2 and the CSL a portion of the memory cells connected to a column corresponding to the second wordline WL2 may be activated.

Then, normal data ND or metadata MD may be input or output from the first GIO lines connected to the column corresponding to the first wordline WL1, and metadata MD or normal data ND may be input or output from the second GIO lines connected to the column corresponding to the second wordline WL2. In this case, parity data may be input or output from the first GIO line M_GIO1 and the second GIO line M_GIO2 of the second side.

The input/output sensing amplifier stage IOSAL may sense and amplify a voltage at a plurality of GIO lines based on data output from the plurality of GIO lines. Alternatively, the input/output sense amplifier stage IOSAL may transmit data to a bank B through a plurality of GIO lines.

Figure 8:
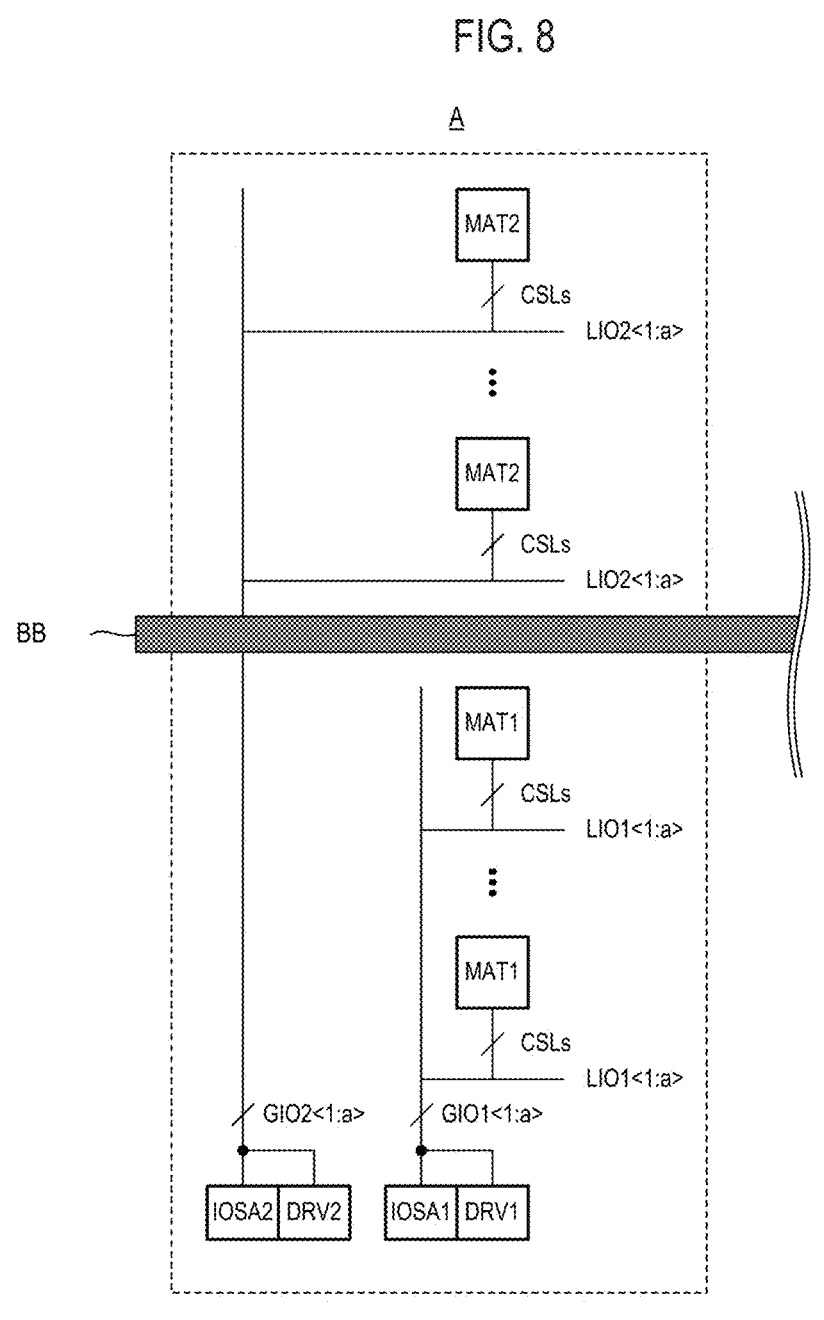

FIG. 8 is a diagram illustrating an example of region "A" of FIG. 7.

Referring to FIG. 8, in some implementations, region "A" may correspond to a single column. The single column may include a plurality of first mats MAT1 included in the first subbank SB1 and a plurality of second mats MAT2 included in the second subbank SB2. The plurality of first mats MAT1 and the plurality of second mats MAT2 may be separated by a bank boundary BB. The plurality of first mats MAT1 and the plurality of second mats MAT2 may be classified into one of the first side to the third side, as described above.

Each of the plurality of first mats MAT1 and the plurality of second mats MAT2 may be connected to a plurality of CSLs.

Writing or reading data in or from each of the plurality of first mats MAT1 may be performed through a plurality of CSLs, a plurality of first local input/output (LIO) lines LIO1<1:a> (where "a" is a positive integer greater than or equal to 8) connected to the plurality of CSLs, and a plurality of first GIO lines GIO1<1:a> connected to the plurality of first LIO lines LIO1<1:a>. Similarly, writing or reading data in or from each of the plurality of second mats MAT2 may be performed through a plurality of CSLs, a plurality of second LIO lines (LIO2<1:a>) connected to the plurality of CSLs, and a plurality of second GIO lines GIO2<1:a> connected to the plurality of second LIOs. In some implementations, a plurality of first GIO lines GIO1<1:a> connected to the plurality of first mats MAT1 and having a relatively small length may be allocated to normal data ND (or metadata MD), and a plurality of second GIO lines GIO2<1:a> connected to a plurality of second mats MAT2 and having a relatively large length may be allocated to metadata MD (or normal data ND).

Based on a write or read command, the first wordline WL1 and the second wordline WL2 may be simultaneously selected and a-numbered bitlines connected to the plurality of CSLs may be selected from each of the first mat MAT1 and the second mat MAT2. For example, when a write operation is performed, normal data ND (or metadata MD) to be written through the plurality of first GIO lines GIO1<1:a> may be input to the selected a-numbered bitlines via the plurality of first LIO lines LIO1<1:a> and the plurality of CSLs. Accordingly, the plurality of first mats MAT1 may store the normal data ND (or the metadata MD). In addition, metadata MD (or normal data ND) to be written through the plurality of second GIO lines GIO2<1:a> may be input to the selected a-numbered bitlines via the plurality of second LIO lines LIO2<1:a> and the plurality of CSLs. Accordingly, the plurality of second mats MAT2 may store the metadata MD (or the normal data ND).

For example, when a read operation is performed, normal data ND (or metadata MD) read from the a-numbered bitlines selected for the plurality of first mats MAT1 may be transmitted to a first input/output sense amplifier IOSA1 via the plurality of CSLs, the plurality of first LIO lines LIO1<1: a>, and the plurality of first GIO lines GIO1<1:a>. In addition, metadata MD (or normal data ND) read from the a-numbered bitlines selected for the plurality of second mats MAT2 may be transmitted to the second input/output sense amplifier IOSA2 via the plurality of CSLs, the plurality of second LIO lines LIO2<1:a>, and the plurality of second GIO lines GIO2<1:a>.

The first input/output sense amplifier IOSA1 and a first driver DRV1 may be connected to a plurality of first GIO lines GIO1<1:a>, and the second input/output sense amplifier IOSA2 and a second driver DRV2 may be connected to the plurality of second GIO lines GIO2<1:a>. The first input/output sense amplifier IOSA1, the first driver DRV1, the second input/output sense amplifier IOSA2, and the second driver DRV2 may be included in the input/output sense amplifier stage IOSAL of FIG. 7.

The first input/output sense amplifier IOSA1 may sense and amplify a voltage at the plurality of first GIO lines GIO1<1:a> based on the data output from the plurality of first GIO lines GIO1<1:a>, and the second input/output sense amplifier IOSA2 may sense and amplify a voltage at the plurality of second GIO lines GIO2<1:a>. For example, normal data ND may be allocated to the plurality of first GIO lines GIO1<1:a> and metadata MD may be allocated to the plurality of second GIO lines GIO2<1:a>. In this case, the first input/output sense amplifier IOSA1 may sense and amplify a voltage based on the normal data ND, and the second input/output sense amplifier IOSA2 may sense and amplify a voltage based on the metadata MD.

The first driver DRV1 may transmit data to a bank through the plurality of first GIO lines GIO1<1:a>, and the second driver DRV2 may transmit data to a bank through the plurality of second GIO lines GIO2<1:a>. For example, when normal data ND is allocated the plurality of first GIO lines GIO1<1:a> and metadata MD is allocated to the plurality of second GIO lines GIO2<1:a>, the first driver DRV1 may transmit the normal data ND to the plurality of first mats MAT1 through the plurality of first GIO lines GIO1<1:a> and the second driver DRV2 may transmit the metadata MD to the plurality of second mats MAT2 through the plurality of second GIO lines GIO2<1:a>.

In some implementations, there is an equal number of each of the input/output sense amplifiers, the drivers, and the GIO lines. Alternatively, when a plurality of first GIO lines GIO1<1:a> are allocated to normal data ND and a plurality of second GIO lines GIO2<1:a> are allocated to metadata MD, the number of first input/output sense amplifiers IOSA1 and the number of first drivers DRV1 provided may be in a ratio of n:1. Alternatively, when a plurality of first GIO lines GIO1<1:a> are allocated to metadata MD and a plurality of second GIO lines GIO2<1:a> are allocated to normal data ND, the number of first input/output sense amplifiers IOSA1 and first drivers DRV1 provided may be in a ratio of 1:n.

Figure 9:
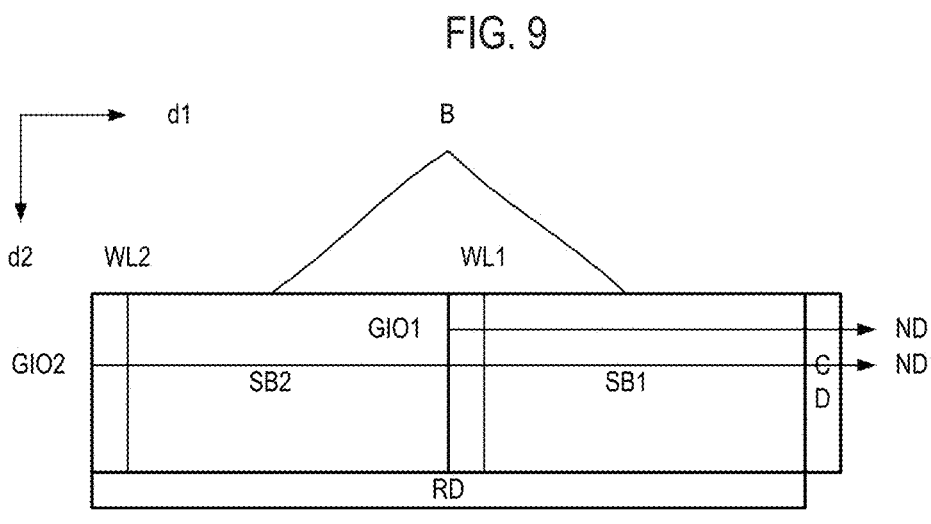
FIG. 9 is a diagram illustrating an example of an operation of a bank when a metadata mode is turned off.

FIG. 9 is a diagram illustrating an example of an operation of a bank when a metadata mode is turned off.

Referring to the example of FIG. 9, each bank included in the bank unit BU of FIG. 2 may simultaneously write or read normal data ND and metadata MD through a GIO line allocated to the normal data ND and a GIO line allocated to the metadata MD in a metadata mode.

In some implementations, when the metadata mode is turned off, the bank may perform a write or read operation of normal data ND. In this case, both the first GIO line GIO1 and the second GIO line GIO2 may be allocated for the normal data ND.

For example, a row decoder may select at least one wordline among a first wordline WL1 and a second wordline WL2. When normal data ND is read from at least one selected wordline, at least one of the first and second GIO lines GIO1 and GIO2 may read the normal data ND. Alternatively, when normal data ND is input from at least one of the first and second GIO lines GIO1 and GIO2, the normal data ND may be written in a memory cell included in at least one subbank among a first subbank SB1 and a second subbank SB2.

Figure 10:
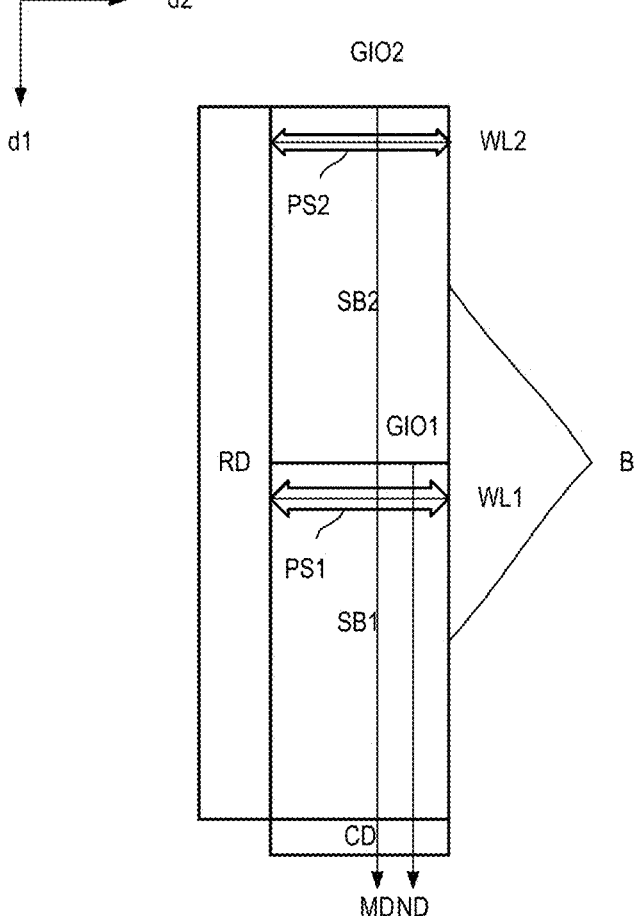

FIG. 10 illustrates an example of the operation of a bank when the metadata mode is turned on.

Referring to the example in FIG. 10, when the metadata mode is turned on, each of the first GIO line GIO1 and the second GIO line GIO2 may be allocated for normal data ND (or metadata MD). FIG. 10 illustrates a case in which the first GIO line GIO1 is allocated for normal data ND and the second GIO line GIO2 is allocated for metadata MD.

Then, the first subbank SB1 may store normal data ND, and the second subbank SB2 may store metadata MD. The first subbank SB1 may write or read normal data ND when the first wordline WL1 is activated, and a write or read operation may be performed in units of first page sizes PS1 corresponding to the first wordline WL1. Similarly, the second subbank SB2 may perform a write or read operation in units of second page sizes PS2 corresponding to the second wordline WL2.

In some implementations, the first page size PS1 and the second page size PS2 may have the same or different sizes. For example, each page size may be 1 KB or 2 KB, but the present disclosure is not limited thereto.

In some implementations, the second page size PS2 for the second subbank SB2 for writing or reading metadata MD may be smaller than the first page size PS1. For example, the number of memory cells to be selected from the second subbank SB2 to correspond to the second wordline WL2 may be smaller than the number of memory cells to be selected from the first subbank SB1 to correspond to the first wordline WL1. In this case, the memory controller 110 and the control logic circuit 140 included in FIG. 1 may control the memory device 120 such that the second page size PS2 is smaller than the first page size PS1 when the memory device 120 operates in the metadata mode.

Figure 11:
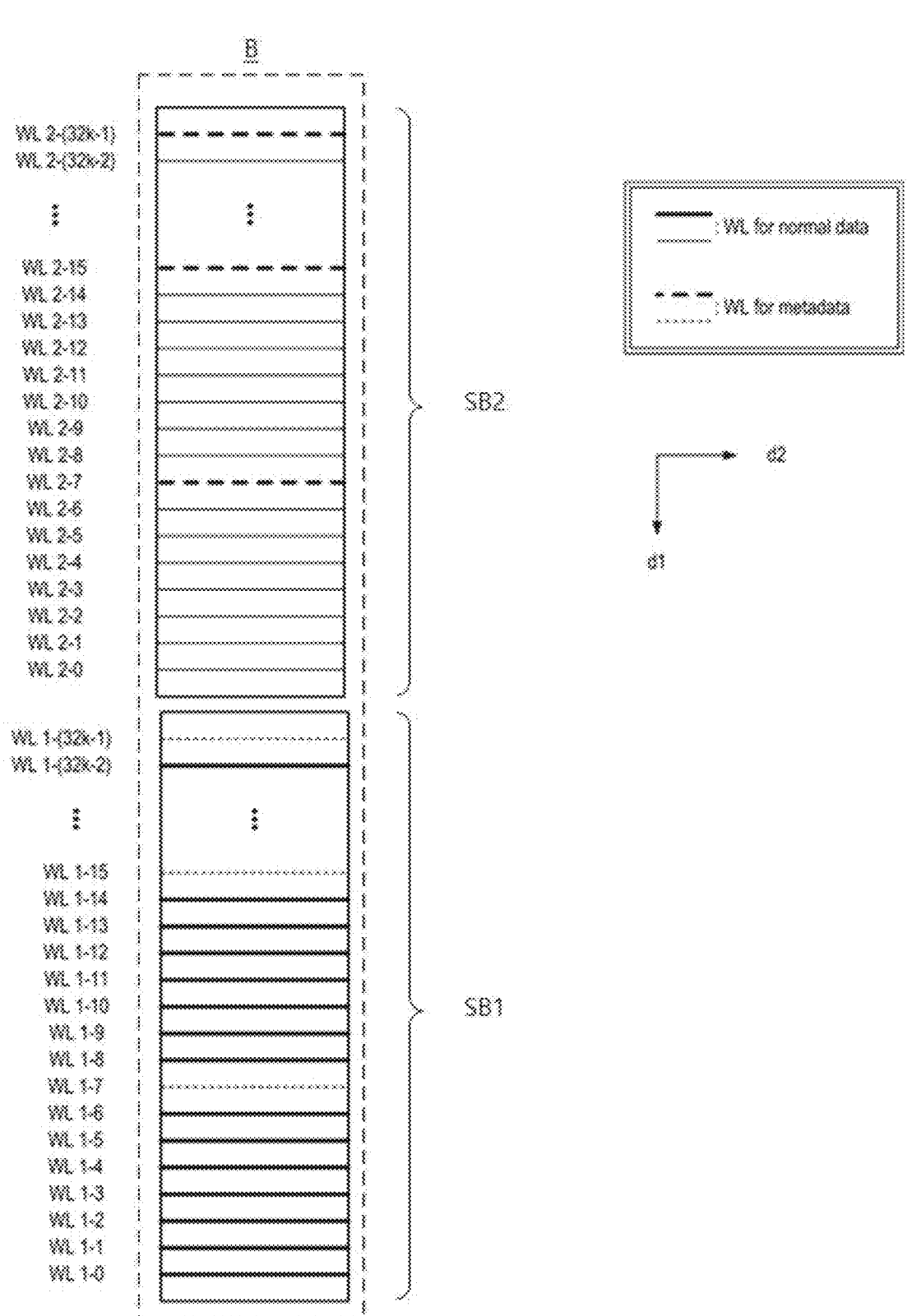
FIGS. 11 and 12 are diagrams illustrating an example of a wordline allocation method.
Figure 12:
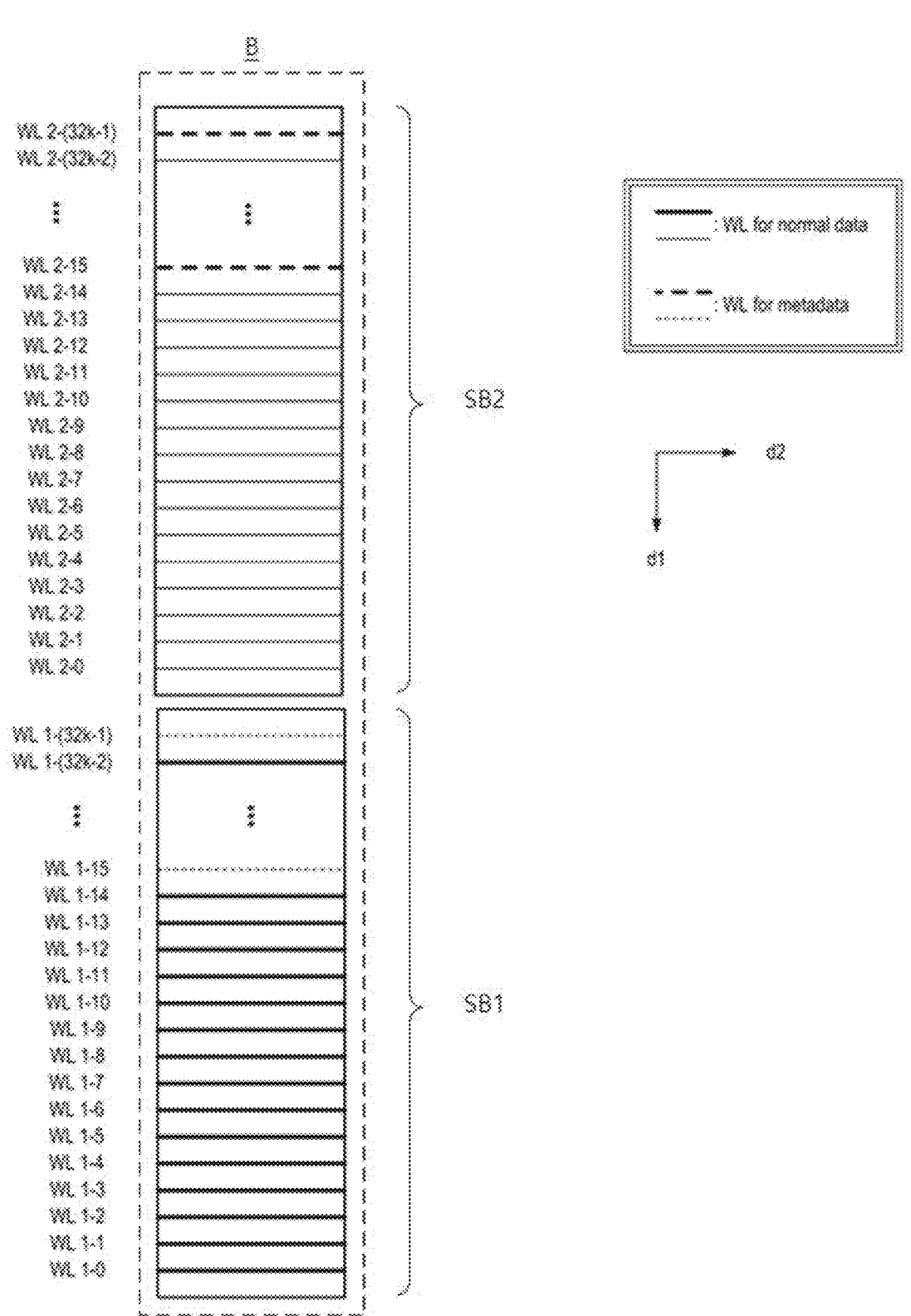

FIGS. 11 and 12 are diagrams illustrating examples of a wordline allocation method. For example, FIG. 11 illustrates a case in which a required normal/meta ratio is 8:1, e.g., n=8, and FIG. 12 illustrates a case in which a required normal/meta ratio is 16:1, e.g., n=16. For example, a required ratio of wordlines allocated for normal data and wordlines allocated for metadata may be n:1. FIG. 11 illustrates an example that may correspond to a case in which a required normal/metadata ratio is 8:1, and FIG. 12 may be an example that may correspond to a case in which a required normal/meta ratio is 16:1.

Referring to FIGS. 11 and 12, a single bank B may be connected to a plurality of wordlines. In some implementations, among the plurality of wordlines, every r-th wordline (where r is a positive integer) in a column direction d1 may be allocated for metadata. For example, the remaining wordlines except for every r-th wordline may be allocated for normal data. In some implementations, a wordlines allocated for metadata are not newly added, but a portion of wordlines present in an existing memory device may be allocated.

In some implementations, a single bank (for example, a first bank B1) may include two subbanks (a first subbank SB1 and a second subbank SB2) divided in a row direction d2. The first subbank SB1 may be connected to a plurality of first wordlines WL1-0 to WL1-(32k−1) among the plurality of wordlines, and the second subbank SB2 may be connected to a plurality of second wordlines WL2-0 to WL2-(32k−1) among the plurality of wordlines. The number of the first wordlines and the second wordlines may be 32k (where k is 1024). In some implementations, every r-th wordline connected to one subbank within a single bank B may be allocated for metadata of another subbank, and every r-th wordline connected to another subbank may be allocated for metadata of one subbank. In this case, the wordline allocated for metadata in one subbank may correspond to the wordline allocated for normal data in another subbank. For example, among the plurality of first wordlines WL1-0 to WL1-(32k−1) of the first subbank SB1, every r-th first wordline may be allocated for metadata for the second subbank SB2 in a column direction d1, and among the plurality of second wordlines WL2-0 to WL2-(32k−1) of the second subbank SB2, every r-th second wordline may be allocated for metadata for the first subbank SB1 in the column direction d1.

Allocating a wordline connected to one subbank for metadata of another subbank may refer to allocating the wordline for metadata corresponding to normal data to be written or read in another subbank. Therefore, in some implementations, wordlines for normal data and wordlines for metadata corresponding to the normal data may be provided to intersect each other in terms of a subbank.

Then, a ratio of the first wordline allocated for metadata among the first wordlines to the remaining first wordlines may be 1:(r−1), and a ratio of the second wordlines allocated for metadata among the second wordlines and the remaining second wordlines may be 1:(r−1).

For example, every r-th first wordline may be allocated to every 1st second wordline WL2-0 to every r-th second wordline WL2-(r−1) among the plurality of second wordlines WL2-0 to WL2-(32k−1). Every r-th second wordline may be allocated to every first wordline WL1-0 to every r−1-th wordline WL1-(r−1) among the plurality of first wordlines WL1-0 to WL1-(32k−1). For example, among the plurality of first wordlines WL1-0 to WL1-(32k−1) of the first subbank SB1, every r-th first wordline may be allocated to read or write metadata corresponding to normal data of every 1st second wordline to every r−1-th second wordline of the second subbank SB2 and among the plurality of second wordlines WL2-0 to WL2-(32k−1) of the second subbank SB2, every r-th first wordline may be allocated to read or write metadata corresponding to normal data of every 1st first wordline to every r−1-th first wordline.

For example, when n is 8 as illustrated in FIG. 11, r may be 8. For example, referring to FIG. 11, when a required ratio of wordlines allocated for normal data and wordlines allocated for metadata is 8:1, every eighth wordline may be allocated for metadata. Then, every eighth wordline may be allocated for metadata, and every first wordline to every seventh wordline may be allocated for normal data. Accordingly, a ratio of normal data wordlines to metadata wordlines may be 7:1.

According to FIG. 11, to support the case in which a required ratio of wordlines allocated for normal data to wordlines allocated for metadata is 8:1, every eighth wordline of one subbank may be allocated to read or write metadata corresponding to normal data of every first to seventh wordlines of another subbank. For example, wordlines WL1-0 to WL1-6 of the first subbank SB1 may be allocated for normal data, and a wordline WL2-7 may be allocated to read and write metadata corresponding to normal data written in or read from wordlines WL1-0 to WL1-6 of the first subbank SB1. In this case, normal data to be written in or read from the wordlines WL1-0 to WL1-6 of the first subbank SB1 may be read through the first GIO line GIO1, and metadata corresponding to the normal data written in the wordline WL2-7 of the second subbank SB2 may be read through the second GIO line GIO2 (see FIGS. 3 and 5).

In contrast, wordlines WL2-0 to WL2-6 of the second subbank SB2 may be allocated for normal data, and a wordline WL1-7 of the first subbank SB1 may be allocated to read and write metadata corresponding to normal data written in or read from wordlines WL2-0 to WL2-6 of the second subbank SB2. In this case, normal data to be written in or read from the wordlines WL2-0 to WL2-6 of the second subbank SB2 may be read through the second GIO line GIO2, and metadata corresponding to the normal data written in the 1-7-th wordline WL1-7 of the first subbank SB1 may be read through the first GIO line GIO1 (see FIGS. 4 and 6)

As a result, in the wordlines WL1-0 to WL1-7 of the first subbank SB1 (or the wordlines WL2-0 to WL2-7 of the second subbank SB2), a ratio of normal data to metadata may be 7:1. The above-described allocation relationship may be repeated from last wordlines (for example, a wordline WL1-(32k−1) and wordline WL2-(32k−1)) in a column direction.

Referring to FIG. 12, when n is 16, r may be 16. For example, referring to FIG. 6, when a required ratio of wordlines allocated for normal data and wordlines allocated for metadata is 16:1, every sixteenth wordline may be allocated for metadata. Then, every sixteenth wordline may be allocated for metadata, and every first wordline to every fifteenth wordline may be allocated for normal data. Therefore, a ratio of normal data wordlines and metadata wordlines may be 15:1.

According to FIG. 12, to support the case in which a required ratio of wordlines allocated for normal data to wordlines allocated for metadata is 16:1, every sixteenth wordline of one subbank may be allocated to read or write metadata corresponding to normal data of every first wordline to every fifteenth wordline of another subbank. For example, wordlines WL1-0 to WL1-14 of the first subbank SB1 may be allocated for normal data, and a wordline WL2-15 of the second subbank SB2 may be allocated to read and write metadata corresponding to normal data written in or read from wordlines WL1-0 to WL1-14 of the first subbank SB1. In this case, normal data to be written or read from the wordlines WL1-0 to WL1-14 of the first subbank SB1 may be read through the first GIO line GIO1, and metadata corresponding to the normal data written in the wordline WL2-15 of the second subbank SB2 may be read through the second GIO line GIO2 (see FIGS. 3 and 5).

In contrast, wordlines WL2-0 to WL2-14 of the second subbank SB2 may be allocated for normal data, and a wordline WL1-15 of the first subbank SB1 may be allocated to read and write metadata corresponding to normal data written in or read from wordlines WL2-0 to WL2-14 of the second subbank SB2. In this case, normal data to be written in or read from the wordlines WL2-0 to WL2-14 of the second subbank SB2 may be read through the second GIO line GIO2, and metadata corresponding to the normal data written in the wordline WL1-15 of the first subbank SB1 may be read through the first GIO line GIO1 (see FIGS. 4 and 6).

As a result, in the wordlines WL1-0 to WL1-15 of the first subbank SB1 (or the wordlines WL2-0 to WL2-15 of the second subbank SB2), a ratio of normal data and metadata may be 15:1. The above-described allocation relationship may be repeated last wordlines (for example, a wordline WL1-(32k–1) and wordline WL2-(32k–1)) in a column direction.

Figure 13:
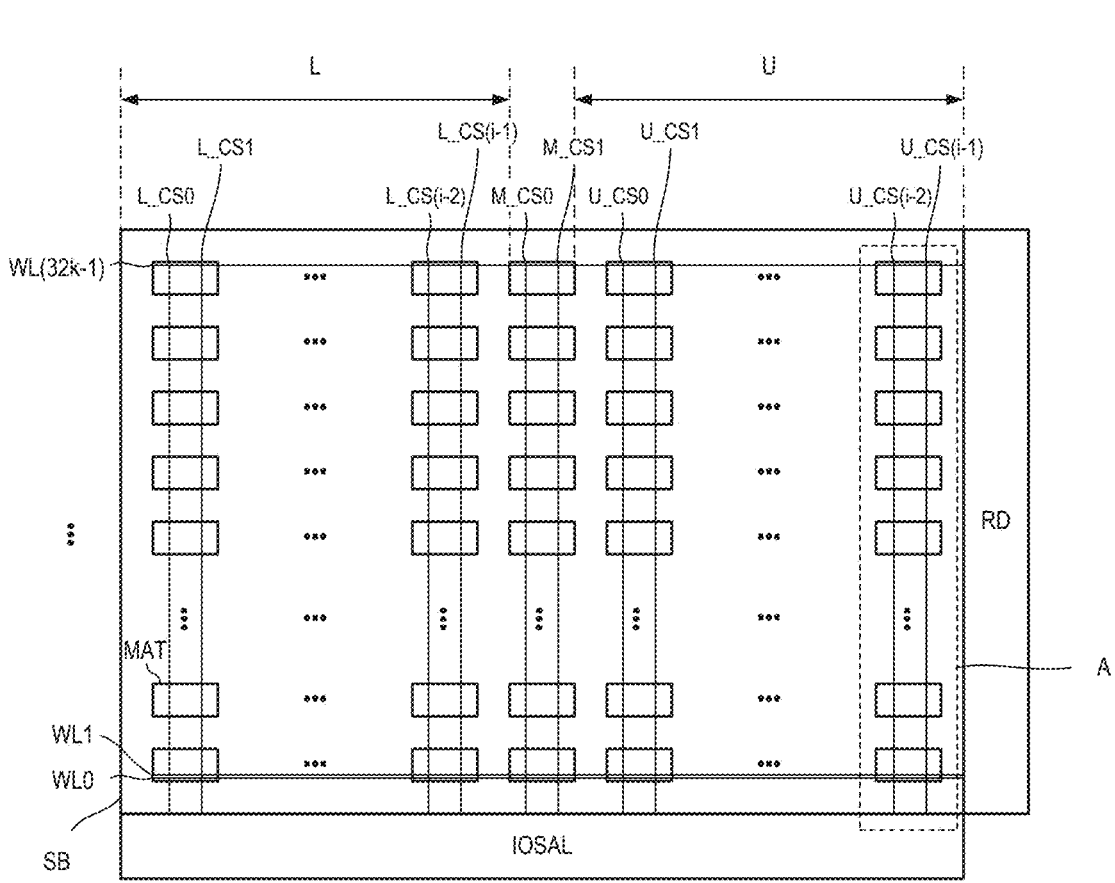
FIGS. 13 and 14 are diagrams illustrating examples of column select signals of normal data and metadata.
Figure 13:
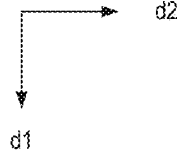

In this example, a portion of existing wordlines may be allocated for metadata to significantly satisfy a required normal/meta ratio without addition of new lines. For example, an allocation relationship between normal data wordlines and metadata wordlines may be established to intersect between subbanks, and thus normal data and metadata may be simultaneously output. FIG. 13 is a diagram illustrating an example of a subbank.

Referring to FIG. 13, a subbank SB may correspond to one of the subbanks SB included in a single bank described in the above examples, and may be connected to a plurality of wordlines WL0 to WL (32k–1) extending in a row direction d2, a plurality of CSL subsets L_CS0 to U_CS(i–1) extending in a column direction d1, and a row decoder RD, and an input/output sense amplifier stage IOSAL. The subbank SB may include a plurality of mats MAT. Some wordlines and some CSLs may be connected to each of the mats MAT. A MAT may include an array of memory cells arranged two-dimensionally, and each of the memory cells may be connected to a single wordline, among some wordlines connected to a corresponding MAT, and a single CSL among some CSLs.

A plurality of CSL subsets L_CS0 to U_CS(i–1) may be connected to a plurality of MATs corresponding to a single column. As illustrated in the drawing, during a single access, a plurality of CSL subsets (L_CS0 to U_CS(i–1) 1)), a pair of CSL subsets may be selected. For example, a pair of CSL subsets L_CS0 and L_CS1 to a pair of CSL subsets L_CS (i–2) and L_CS(i–1) (where i is a positive integer) may be selected at a first side L, and a pair of CSL subsets U_CS0 and U_CS1 to a pair of CSL subsets U_CS(i–2) and U_CS (i–1) may be selected at a second side R. In addition, a pair of CSL subsets M_CS0 and M_CS1 may be selected.

Figure 14:
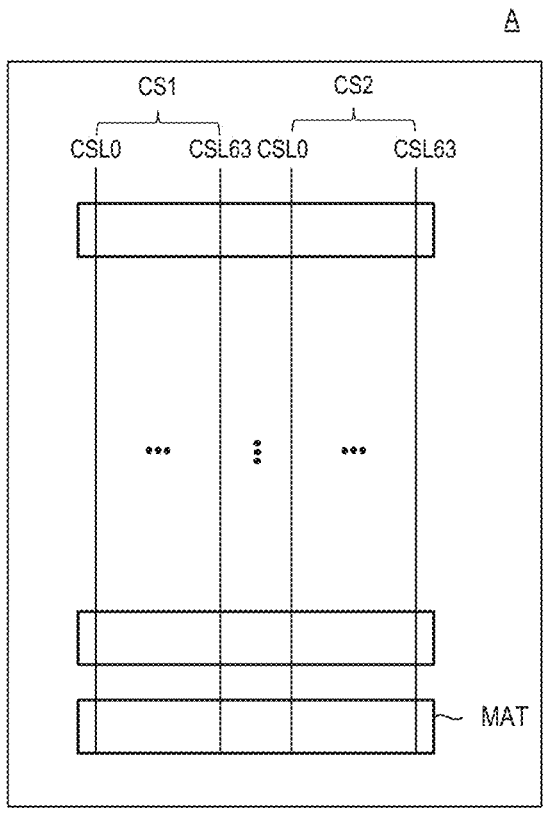

FIG. 14 is a diagram illustrating an example of region "A" of FIG. 7.

Referring to FIG. 14, for example, a plurality of CSLs that may be classified into CSL groups CS1 and CS2 may be connected to a plurality of MATs corresponding to a single CSL block CB. A portion of the plurality of CSLs may be connected to each of the CSL groups CS1 and CS2. As an example, a plurality of CSLs, for example, 64 CSLs CSL0 to CSL63 as illustrated, may be connected to each of the CSL groups CS1 and CS2. Accordingly, a total of 128 CSLs may be connected to a single CSL block CB. During a single access, a single CSL may be selected from each of the CSL groups CS1 and CS2. Hereinafter, unless otherwise specified, a CSL selected from the CSL groups CS1 and CS2 for each CSL block CB and ECC block in a single subbank SB will be referred to as a CSL subset, and a CSL selected for each CSL block CB will be referred to as a pair of CSL subsets.

Returning to FIG. 13, in some implementations, a pair of CSL subsets or a portion of the pair of CSL subsets corresponding to a single CSL block CB included in a single subbank SB may be allocated to a single wordline among wordlines connected to remaining subbanks constituting a bank together with the single subbank SB, for example, a single wordline among wordlines for normal data. For example, all CSL subsets included in the single subbank SB may each be allocated to one of the normal data wordlines connected to the remaining subbanks. In some implementations, referring to FIG. 9, the single subbank SB may correspond to the first subbank SB1 of FIG. 9, and the remaining subbanks may correspond to the second subbank SB2 of FIG. 9.

For example, in some implementations, a single bank may include one subbank SB and another subbank. In this case, when an access to normal data is performed through remaining wordlines, other than every r-th wordline, in one subbank SB, an access to metadata may be performed on every r-th wordline in another subbank. In this case, a pair of CSL subsets in another subbank or a portion of the pair of CSL subsets may be allocated to each of the remaining wordlines of the single subbank SB. Accordingly, when the access to normal data is performed on one of the remaining wordlines of the single subbank SB is performed, an access to metadata may be performed on the pair of CSL subsets or a portion of the pair of CSL subsets allocated to one of the remaining wordlines.

All CSL subsets may be selected in a normal-side subbank SB in which an access to normal data is performed. Accordingly, the access to normal data may be performed on the normal data wordline and all of the CSL subsets.

In some implementations, a pair of CSL subsets L_CS0, L_CS1 to L_CS(i–2), and L_CS(i–1) included in the first side L, among the CSL subsets connected to the single subbank SB, and a pair of CSL subsets U_CS0, U_CS1 to U_CS(i–2), and U_CS(i–1) included in the second side U may be sequentially allocated from a pair of CSL subsets having a lowest index to the normal data wordline connected to the remaining subbanks SB.

In some implementations, among the CSL subsets connected to the single subbank SB, the CSL subsets L_CS0 to L_CS(i–1) included in the first side L and the CSL subsets U_CS0 to U_CS(i–1) included in the second side U may be sequentially allocated from a CSL subset having a lowest index to the normal data wordlines connected to the remaining subbanks SB.

FIGS. 15 and 16 are diagrams illustrating examples of column select signals of normal data and metadata. FIGS. 15 and 16 illustrate an example of a combination of meta-side subbank (MSB)-side column select signals corresponding to normal-side subbank (NSB)-side column select signals. Although the distinction between NSB and MSB is based on a location in which normal data is stored, each subbank may be regarded as an NSB and an MSB based on an opposite subbank. For example, referring to FIG. 6, when a first subbank SB1 is an NSB, an MSB may be a second subbank SB2. In addition, when the SB2 is an NSB, an MSB may be a first subbank SB1.

In FIGS. 15 and 16, CSLx[m:n] may be defined as a column select signal, a signal for selecting a CSL. The column select signal may be generated through a column decoder.

Here, m and n represent a range of a CSL subset to be selected from among the plurality of CSL subsets allocated to a single bank (or subbank) and are also positive integers. For example, m represents a lowest index among indices of the CSL subsets to be selected, and n represents a highest index among the indices of the CSL subsets to be selected.

The column decoder may select m-th to n-th CSL subsets from the CSL subsets on each of the first and second sides for a single bank (or subbank) based on CSLx[m:n], and may select an x-th CSL from a plurality of CSLs corresponding to the selected CSL subsets. For example, when m=0 and n=1 in FIG. 13, the column decoder may select L_CS0 and L_CS1 at the first side L and select U_CS0 and U_CS1 at the second side U.

Here, x represents an index of a CSL to be selected from among a plurality of CSLs included in each of the pair of CSL subsets in FIG. 14, where x is a positive integer. Referring to FIG. 14, for example, when x=1, CSL1 may be selected from CS1 and CSL1 may be selected from CS2.

Returning to FIG. 15, for example, when a required normal/meta ratio is 8, every eighth wordline may be allocated for metadata. For example, a ratio of wordlines allocated for normal data to wordlines allocated for metadata may be actually 7:1. This is aimed at significantly satisfying the required ratio of 8:1 without additional chip size overhead.

In terms of the normal-side subbank NSB, an access to normal data may be performed on each of the first to seventh wordlines WL0 to WL6. In this case, the column select signal for the normal-side subbank NSB may be CSLx[0:15] to select all CSL subsets, and a value of x may range from 0 to 63, as illustrated in FIG. 9. The eighth wordline WL7 of the normal-side subbank NSB may be allocated for the meta-side subbank MSB.

Next, in terms of the meta-side subbank MSB, the eighth wordline WL7 may be allocated for the normal-side subbank NSB. In this case, the column select signal may be defined based on a wordline accessed in the normal-side subbank NSB. In this example, a pair of CSL subsets of the meta-side subbank MSB may be sequentially allocated to a normal data wordline connected to the normal-side subbank NSB. For example, when the first wordline WL0 of the normal-side subbank NSB is accessed, m and n of the column select signal may be determined to be respectively 0 and 1 to select a pair of CSL subsets having the lowest index. Next, when the second wordline WL1 of the normal-side subbank NSB is accessed, m and n of the column select signal may be determined to be m=2 and n=3 to select a pair of CSL subsets having the next index. When the last sixth wordline WL6 is accessed, m and n of the column select signal may be determined to be m=12 and n=13 based on the above-described allocation relationship. In this example, the fifteenth and sixteenth CSL subsets at the meta-side may not be allocated.

According to the above-described column select signal of FIG. 15, for example, when eight bitlines are connected per CSL, 256 bits of normal data (8 bits×32 (the number of CSL subsets selected in the normal-side subbank NSB)), 32 bits of normal data (8 bits×4 (the number of CSL subsets selected in the meta-side subbank MSB)), and 16 bits of parity bits may be output during an access to a single wordline.

Referring to FIG. 16 for example, when a required normal/meta ratio is 16, every sixteenth wordline may be allocated for metadata. For example, a ratio of wordlines allocated for normal data and wordlines allocated for metadata may be actually 15:1. This is aimed at significantly satisfying the required ratio of 16:1 without additional chip size overhead.

In terms of the normal-side subbank NSB, an access to normal data may be performed on each of the first to fifteenth wordlines WL0 to WL14. As described above, a column select signal for the normal-side subbank NSB may be CSLx[0:15] to select all CSL subsets. Similarly, the sixteenth wordline WL15 of the normal-side subbank NSB may be allocated for the meta-side subbank MSB.

Next, in terms of the meta-side subbank MSB, the sixteenth wordline WL15 may be allocated for the normal-side subbank NSB. In this example, the CSL subsets of the meta-side subbank MSB may be sequentially assigned from the CSL subset having the lowest index to the normal data wordline for normal data connected to the normal-side subbank NSB. Unlike FIG. 9, only one CSL subset is selected, so that a column select signal of the meta-side subbank MSB may be defined as CSLx[m].

For example, when the first wordline WL0 of the normal-side subbank NSB is accessed, m of the column select signal may be determined to be 0 to select the CSL subset having the lowest index. Next, when the second wordline WL1 of the normal-side subbank NSB is accessed, m of the column select signal may be determined to be 1 to select the CSL subset having the next index. According to the above-described allocation relationship, when the last fifteenth wordline WL14 is accessed, m of the column select signal may be determined to be 15. In this example, the sixteenth CSL subset at the meta-side may not be allocated.

According to the above-described column select signal of FIG. 16, for example, when eight bitlines are connected per CSL, 256 bits of normal data (8 bits×32 (the number of CSL selected in the normal-side subbank NSB)), 16 bits of metadata (8 bits×2 (the number of CSL subsets selected in the meta-side subbank MSB)), and 16 bits of parity bits may be output during an access to a single wordline.

In this example, when a bank operates in a metadata mode and activates two wordlines simultaneously, a page size of a subbank corresponding to metadata MD may be controlled to be less than a page size of a subbank corresponding to normal data ND. Accordingly, even when an increase in current occurs due to simultaneous activation of two wordlines, the page size corresponding to metadata MD may be reduced to offset current generated due to simultaneous activation of wordlines.

As set forth above, in some implementations, a volatile memory device for allocating specific data may be provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations, one or more features from a combination can in some cases be excised from the combination, and the combination may be directed to a sub-combination or variation of a sub-combination.

While example embodiments have been shown and described above, it will be apparent to those skilled in the art that modifications and variations could be made without departing from the scope of the present inventive concept as defined by the appended claims.

What is claimed is:

1. A memory device comprising:
   a bank comprising a first subbank and a second subbank, wherein the bank is connected to a plurality of wordlines, wherein a first global input and output (GIO) line has a first length in a column direction, and a second GIO line has a second length in the column direction, wherein the second length is larger than the first length, wherein one of the first GIO line and the second GIO line is allocated for metadata, wherein one of the first GIO line and the second GIO line is configured to input or output metadata, and the other one of the first GIO line and the second GIO line is configured to input or output normal data corresponding to the metadata, and wherein at least one wordline of the plurality of wordlines connected to the first subbank is allocated for the metadata of the second subbank, and at least one wordline of the plurality of wordlines connected to the second subbank is allocated for the metadata of the first subbank.

2. The memory device of claim 1, wherein:

the bank is divided into the first subbank and the second subbank in the column direction, the first subbank is connected to a first wordline included in the plurality of wordlines and the first GIO line, and the second subbank is connected to a second wordline included in the plurality of wordlines and the second GIO line.

3. The memory device of claim 2, wherein the first GIO line and the second GIO line are configured to simultaneously input or output data based on activating the first wordline and the second wordline.

4. The memory device of claim 1, wherein the one of the first GIO line and the second GIO line is configured to input or output the metadata, and the other one of the first GIO line and the second GIO line is configured to input or output the normal data corresponding to the metadata simultaneously.

5. The memory device of claim 4, wherein a ratio of the metadata to the normal data is 1:n, where n is a positive integer.

6. The memory device of claim 1, wherein the first GIO line and the second GIO line are each provided with M GIO lines, where M is a positive integer.

7. The memory device of claim 1, wherein the first GIO line and the second GIO line comprise different metals.

8. The memory device of claim 1, further comprising:

a row decoder configured to select the plurality of wordlines; and a column decoder configured to select a plurality of column select lines (CSLs), respectively connected to the first GIO line and the second GIO line.

9. The memory device of claim 8, wherein the row decoder is configured to simultaneously select a first wordline and a second wordline, among the plurality of wordlines.

10. The memory device of claim 1, further comprising:

a first sense amplifier connected to the first GIO line and configured to sense and amplify data output from the first GIO line; and a second sense amplifier connected to the second GIO line and configured to sense and amplify data output from the second GIO line.

11. The memory device of claim 10, wherein:

the first GIO line is one first GIO line of a plurality of first GIO lines, the second GIO line is one second GIO line of a plurality of second GIO lines, the first sense amplifier is one first input/output sense amplifier of a plurality of first input/output sense amplifiers, the second sense amplifier is one second input/output sense amplifier of a plurality of second input/output sense amplifiers, there is a first same number of the plurality of first input/output sense amplifiers and the plurality of first GIO lines, and there is a second same number of the plurality of second input/output sense amplifiers and the plurality of second GIO lines.

12. A memory device comprising:

a bank comprising a first subbank and a second subbank, wherein the bank is connected to a plurality of wordlines, a first global input and output (GIO) line, and a second GIO line, wherein the second GIO line has a larger length than the first GIO line in a column direction; and a row decoder connected to the plurality of wordlines, extending in the column direction, and configured to select the plurality of wordlines, wherein one of the first GIO line and the second GIO line is allocated for metadata, wherein one of the first GIO line and the second GIO line is configured to input or output metadata, and the other one of the first GIO line and the second GIO line is configured to input or output normal data corresponding to the metadata, and wherein at least one wordline of the plurality of wordlines connected to the first subbank is allocated for the metadata of the second subbank, and at least one wordline of the plurality of wordlines connected to the second subbank is allocated for the metadata of the first subbank.

13. The memory device of claim 12, wherein:

the bank is divided into the first subbank and the second subbank in the column direction, the first subbank is connected to a first wordline included in the plurality of wordlines and the first GIO line, and the second subbank is connected to a second wordline included in the plurality of wordlines and the second GIO line.

14. The memory device of claim 13, wherein the row decoder is configured to simultaneously select the first wordline and the second wordline in an operation mode for inputting or outputting the metadata.

15. The memory device of claim 12, wherein the one of the first GIO line and the second GIO line is configured to input or output the metadata and the other one of the first GIO line and the second GIO line simultaneously inputs or outputs the normal data corresponding to the metadata, in an operation mode for inputting or outputting the metadata.

16. The memory device of claim 15, wherein the one of the first GIO line and the second GIO line and the other one of the first GIO line and the second GIO line are configured to input or output the normal data when the operation mode is turned off.

17. The memory device of claim 12, wherein a ratio of the metadata to the normal data input or output is 1:n, where n is a positive integer.

18. A memory device comprising:

a bank comprising a plurality of subbanks divided in a column direction;

a plurality of wordlines, each extending in a row direction and connected to the plurality of subbanks; and a plurality of global input and output (GIO) lines extending in the column direction and connected to the plurality of subbanks, wherein the plurality of GIO lines comprise two GIO lines connected to different subbanks, and one of the two GIO lines is allocated for metadata, wherein a first GIO line of the two GIO lines is configured to input or output metadata, and a second GIO line of the two GIO lines is configured to input or output normal data corresponding to the metadata, and wherein at least one wordline of the plurality of wordlines connected to a first subbank of the plurality of subbanks is allocated for the metadata of a second subbank of the plurality of subbanks, and at least one wordline of the plurality of wordlines connected to the second subbank is allocated for the metadata of the first subbank.

19. The memory device of claim 18, wherein the two GIO lines are formed to have different lengths in the column direction.

20. The memory device of claim 18, wherein two word-lines among the plurality of wordlines that are connected to the different subbanks are simultaneously activated.

\* \* \* \* \*